United States Patent
Rains, Jr. et al.

(10) Patent No.: US 8,702,271 B2
(45) Date of Patent: *Apr. 22, 2014

(54) PHOSPHOR-CENTRIC CONTROL OF COLOR OF LIGHT

(71) Applicant: ABL IP Holding LLC, Conyers, GA (US)

(72) Inventors: Jack C. Rains, Jr., Herdon, VA (US); David P. Ramer, Reston, VA (US)

(73) Assignee: ABL IP Holding LLC, Conyers, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/754,353

(22) Filed: Jan. 30, 2013

(65) Prior Publication Data

US 2013/0141014 A1    Jun. 6, 2013

Related U.S. Application Data

(63) Continuation of application No. 12/754,261, filed on Apr. 5, 2010, now Pat. No. 8,517,550.

(60) Provisional application No. 61/304,560, filed on Feb. 15, 2010.

(51) Int. Cl.
*H05B 33/14* (2006.01)
(52) U.S. Cl.
USPC .......................................... 362/235; 315/294
(58) Field of Classification Search
USPC ............................. 362/84, 235; 313/294, 503
See application file for complete search history.

(56) References Cited

U.S. PATENT DOCUMENTS

| | | |
|---|---|---|
| 3,636,341 A | 1/1972 | Miller |
| 5,099,343 A | 3/1992 | Margerum et al. |
| 5,502,626 A | 3/1996 | Armstrong et al. |

(Continued)

FOREIGN PATENT DOCUMENTS

| | | |
|---|---|---|
| EP | 2 144 275 A2 | 1/2010 |
| WO | WO-01/66997 A2 | 9/2001 |

(Continued)

OTHER PUBLICATIONS

Notice of Allowance issued Apr. 8, 2013, in U.S. Appl. No. 12/754,261, filed Apr. 5, 2010, entitled "Phosphor-Centric Control of Color of Light."

(Continued)

*Primary Examiner* — Anabel Ton
(74) *Attorney, Agent, or Firm* — RatnerPrestia

(57) ABSTRACT

Lighting devices and/or systems offer dynamic control or tuning of color of light. The lighting systems utilize sources, such as solid state sources, to individually pump a number of different phosphors of types having relatively high degrees of color purity. The phosphor emissions, however, are still broader than the traditionally monochromatic color emissions of LEDs. The different phosphors can be independently excited to controllable levels, by individually controlled sources rated for emission of energy of the same spectrum. Adjustment of intensities of electromagnetic energy emitted by the sources independently adjusts levels of excitations of the phosphors selected to emit different colors of relatively high purity and thus the contributions of pure colors to the combined light output, for example, to enables color adjustment of the light output over a wide range of different selectable colors encompassing much of the gamut of visible light.

20 Claims, 14 Drawing Sheets

(56) References Cited

U.S. PATENT DOCUMENTS

| | | |
|---|---|---|
| 5,549,844 A | 8/1996 | Bringley et al. |
| 5,608,213 A | 3/1997 | Pinkus et al. |
| 5,753,918 A | 5/1998 | Pandelisev |
| 5,803,592 A | 9/1998 | Lawson |
| 5,851,428 A | 12/1998 | Matsuda et al. |
| 5,877,490 A | 3/1999 | Ramer et al. |
| 5,914,487 A | 6/1999 | Ramer et al. |
| 6,007,225 A | 12/1999 | Ramer et al. |
| 6,222,623 B1 | 4/2001 | Wetherell |
| 6,234,648 B1 | 5/2001 | Borner et al. |
| 6,286,979 B1 | 9/2001 | Ramer et al. |
| 6,357,889 B1 | 3/2002 | Duggal et al. |
| 6,361,192 B1 | 3/2002 | Fussell et al. |
| 6,422,718 B1 | 7/2002 | Anderson et al. |
| 6,437,861 B1 | 8/2002 | Kuta |
| 6,447,698 B1 | 9/2002 | Ihara et al. |
| 6,473,554 B1 | 10/2002 | Pelka et al. |
| 6,536,914 B2 | 3/2003 | Hoelen et al. |
| 6,566,824 B2 | 5/2003 | Panagotacos et al. |
| 6,612,717 B2 | 9/2003 | Yen |
| 6,692,136 B2 | 2/2004 | Marshall et al. |
| 6,700,112 B2 | 3/2004 | Brown |
| 6,734,465 B1 | 5/2004 | Taskar et al. |
| 6,737,681 B2 | 5/2004 | Koda |
| 6,836,083 B2 | 12/2004 | Mukai |
| 6,869,545 B2 | 3/2005 | Peng et al. |
| 6,872,249 B2 | 3/2005 | Peng et al. |
| 6,960,872 B2 | 11/2005 | Beeson et al. |
| 6,969,843 B1 | 11/2005 | Beach et al. |
| 6,985,163 B2 | 1/2006 | Riddle et al. |
| 6,995,355 B2 | 2/2006 | Rains, Jr. et al. |
| 7,025,464 B2 | 4/2006 | Beeson et al. |
| 7,040,774 B2 | 5/2006 | Beeson et al. |
| 7,058,103 B2 | 6/2006 | Ishida et al. |
| 7,102,152 B2 | 9/2006 | Chua et al. |
| 7,105,051 B2 | 9/2006 | Peng et al. |
| 7,144,131 B2 | 12/2006 | Rains |
| 7,148,632 B2 | 12/2006 | Berman et al. |
| 7,153,703 B2 | 12/2006 | Peng et al. |
| 7,160,525 B1 | 1/2007 | Peng et al. |
| 7,192,850 B2 | 3/2007 | Chen et al. |
| 7,220,039 B2 | 5/2007 | Ahn et al. |
| 7,235,190 B1 | 6/2007 | Wilcoxon et al. |
| 7,235,792 B2 | 6/2007 | Elofson |
| 7,259,400 B1 | 8/2007 | Taskar |
| 7,273,904 B2 | 9/2007 | Peng et al. |
| 7,350,933 B2 | 4/2008 | Ng et al. |
| 7,374,807 B2 | 5/2008 | Parce et al. |
| 7,481,553 B2 | 1/2009 | Kim et al. |
| 7,510,299 B2 | 3/2009 | Timmermans et al. |
| 7,531,149 B2 | 5/2009 | Peng et al. |
| 7,543,961 B2 | 6/2009 | Arik et al. |
| 7,560,677 B2 | 7/2009 | Lyons et al. |
| 7,618,157 B1 | 11/2009 | Galvez et al. |
| 7,768,192 B2 | 8/2010 | Van De Ven et al. |
| 7,845,825 B2 | 12/2010 | Ramer et al. |
| 7,889,421 B2 | 2/2011 | Narendran et al. |
| 7,905,644 B2 | 3/2011 | Chen |
| 8,016,470 B2 | 9/2011 | Li et al. |
| 8,079,729 B2 | 12/2011 | Van De Ven et al. |
| 2004/0012027 A1 | 1/2004 | Keller et al. |
| 2004/0062041 A1 | 4/2004 | Cross et al. |
| 2004/0135504 A1 | 7/2004 | Tamaki et al. |
| 2004/0151008 A1 | 8/2004 | Artsyukhovich et al. |
| 2004/0188594 A1 | 9/2004 | Brown et al. |
| 2004/0201990 A1 | 10/2004 | Meyer |
| 2004/0257807 A1 | 12/2004 | Endo et al. |
| 2005/0093430 A1 | 5/2005 | Ibbetson et al. |
| 2005/0156103 A1 | 7/2005 | May et al. |
| 2005/0161586 A1 | 7/2005 | Rains et al. |
| 2005/0279915 A1 | 12/2005 | Elofson |
| 2006/0068154 A1 | 3/2006 | Parce et al. |
| 2006/0072314 A1 | 4/2006 | Rains |
| 2006/0289884 A1 | 12/2006 | Soules et al. |
| 2006/0291226 A1 | 12/2006 | Daicho et al. |
| 2007/0024173 A1 | 2/2007 | Braune |
| 2007/0034833 A1 | 2/2007 | Parce et al. |
| 2007/0045524 A1 | 3/2007 | Rains, Jr. et al. |
| 2007/0051883 A1 | 3/2007 | Rains, Jr. et al. |
| 2007/0070621 A1 | 3/2007 | Rivas et al. |
| 2007/0096118 A1 | 5/2007 | Mahalingam et al. |
| 2007/0138978 A1 | 6/2007 | Rains, Jr. et al. |
| 2007/0153518 A1 | 7/2007 | Chen |
| 2007/0170454 A1 | 7/2007 | Andrews |
| 2007/0183152 A1 | 8/2007 | Hauck et al. |
| 2007/0228999 A1 | 10/2007 | Kit |
| 2007/0235639 A1 | 10/2007 | Rains |
| 2007/0291505 A1 | 12/2007 | Fortenberry et al. |
| 2008/0020235 A1 | 1/2008 | Parce et al. |
| 2008/0024067 A1 | 1/2008 | Ishibashi |
| 2008/0030974 A1 | 2/2008 | Abu-Ageel |
| 2008/0043480 A1 | 2/2008 | Kong |
| 2008/0084706 A1 | 4/2008 | Roshan et al. |
| 2008/0094835 A1 | 4/2008 | Marra et al. |
| 2008/0106887 A1 | 5/2008 | Salsbury et al. |
| 2008/0224025 A1 | 9/2008 | Lyons et al. |
| 2008/0237540 A1 | 10/2008 | Dubrow |
| 2008/0246017 A1 | 10/2008 | Gillies et al. |
| 2008/0291670 A1 | 11/2008 | Rains |
| 2008/0315784 A1 | 12/2008 | Tseng |
| 2009/0002986 A1 | 1/2009 | Medendorp, Jr. et al. |
| 2009/0003002 A1 | 1/2009 | Sato |
| 2009/0034292 A1 | 2/2009 | Pokrovskiy et al. |
| 2009/0162011 A1 | 6/2009 | Coe-Sullivan et al. |
| 2009/0195186 A1 | 8/2009 | Guest et al. |
| 2009/0268461 A1 | 10/2009 | Deak et al. |
| 2009/0290352 A1 | 11/2009 | Wu et al. |
| 2009/0295266 A1 | 12/2009 | Ramer et al. |
| 2009/0296368 A1 | 12/2009 | Ramer |
| 2009/0302730 A1 | 12/2009 | Carroll et al. |
| 2010/0002414 A1 | 1/2010 | Meir et al. |
| 2010/0002453 A1 | 1/2010 | Wu et al. |
| 2010/0053970 A1 | 3/2010 | Sato et al. |
| 2010/0053977 A1 | 3/2010 | Chen |
| 2010/0123155 A1 | 5/2010 | Pickett et al. |
| 2010/0124058 A1 | 5/2010 | Miller |
| 2010/0172120 A1 | 7/2010 | Wegh et al. |
| 2010/0276638 A1 | 11/2010 | Liu et al. |
| 2010/0301728 A1 | 12/2010 | Helbing et al. |
| 2011/0095686 A1 | 4/2011 | Falicoff et al. |
| 2011/0127557 A1 | 6/2011 | Ramer et al. |
| 2011/0128718 A1 | 6/2011 | Ramer et al. |
| 2011/0140593 A1 | 6/2011 | Negley et al. |
| 2011/0175528 A1 | 7/2011 | Rains, Jr. et al. |
| 2011/0175546 A1 | 7/2011 | Ramer et al. |
| 2011/0176289 A1 | 7/2011 | Ramer et al. |
| 2011/0176316 A1 | 7/2011 | Phipps et al. |
| 2011/0199753 A1* | 8/2011 | Ramer et al. .................... 362/84 |
| 2013/0009567 A1* | 1/2013 | Ramer et al. .................. 315/294 |

FOREIGN PATENT DOCUMENTS

| | | |
|---|---|---|
| WO | 2008134056 A1 | 11/2008 |
| WO | WO-2009/137053 A1 | 11/2009 |
| WO | WO-2009/146261 A1 | 12/2009 |
| WO | WO-2009/146262 A1 | 12/2009 |
| WO | WO-2010/012999 A2 | 2/2010 |

OTHER PUBLICATIONS

United States Notice of Allowance issued in U.S. Appl. No. 12/629,614 dated Aug. 5, 2010.

International Search Report and the Written Opinion of the International Searching Authority issued in International Application No. PCT/US2011/024789 dated May 27, 2011.

Transmittal of International Search Report and Written Opinion of the International Searching Authority issued in International Patent Application No. PCT/US2010/058716 dated May 24, 2011.

Transmittal of International Search Report and Written Opinion of the International Searching Authority issued in International Patent Application No. PCT/US2011/024783 dated May 31, 2011.

Transmittal of International Search Report and Written Opinion of the International Searching Authority issued in International Patent

(56) References Cited

OTHER PUBLICATIONS

Application No. PCT/US2011024787 dated May 27, 2011.
United States Office Action issued in U.S. Appl. No. 12/940,634 dated Mar. 22, 2011.
United States Office Action issued in U.S. Appl. No. 12/729,582 dated Sep. 22, 2011.
United States Office Action issued in U.S. Appl. No. 12/940,634 dated Aug. 10, 2011.
United States Office Action issued in U.S. Appl. No. 12/729,542 dated Oct. 11, 2011.
United States Office Action, issued in U.S. Appl. No. 12/836,022, dated Jan. 26, 2012.
United States Office Action, issued in U.S. Appl. No. 12/729,542, dated Feb. 17, 2012.
US Notice of Allowance issued in U.S. Appl. No. 12/729,582 dated Mar. 2, 2012.
US Notice of Allowance issued in U.S. Appl. No. 12/940,634 dated Feb. 17, 2012.
US Office Action issued in U.S. Appl. No. 12/836,022 dated Jun. 22, 2012.
International Preliminary Report on Patentability issued in International PCT/US2010/028247 dated Jun. 14, 2012.
International Preliminary Report on Patentability issued in International PCT/US2010/058716 dated Jun. 14, 2012.
International Preliminary Report on Patentability and Written Opinion issued in International Patent Application No. PCT/US2011/024783 dated Aug. 30, 2012.
International Preliminary Report on Patentability and Written Opinion issued in International Patent Application No. PCT/US2011/024787 dated Aug. 30, 2012.
International Preliminary Report on Patentability and Written Opinion issued in International Patent Application No. PCT/US2011/024789 dated Aug. 30, 2012.
Entire Prosecution of U.S. Appl. No. 12/754,261 to Jack C. Rains et al., filed Apr. 5, 2010, entitled ., "Phosphor-Centric Control of Color of Light."
US Office Action issued in U.S. Appl. No. 13/621,106 mailed Nov. 9, 2012.
Non-final Office Action dated Oct. 7, 2013, issued in U.S. Appl. No. 12/729,788.
Mike Rutherford, opinion letter dated Sep. 8, 2013, regarding US Patent No. 6,734,465 by Taskar.
Mike Rutherford, opinion letter dated Sep. 10, 2013, regarding US Patent No. 7,723,744 by Gillies.

* cited by examiner

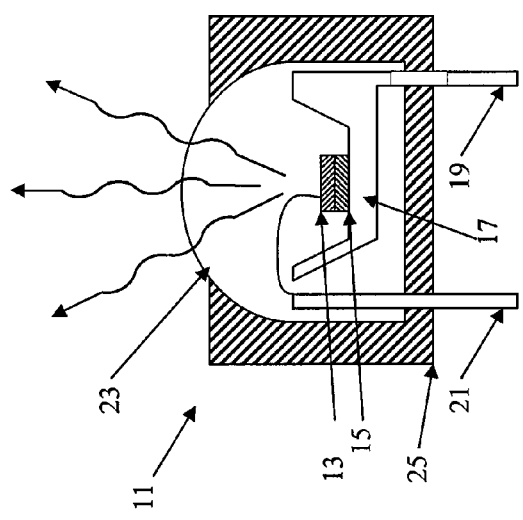
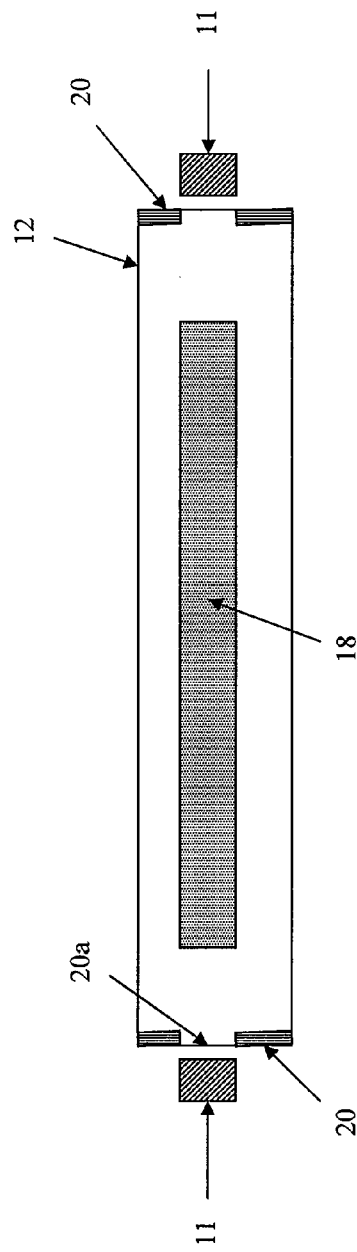
FIG. 2
FIG. 3

| | Blue | Green | Red | 4th |
|---|---|---|---|---|
| Wavelength | 450 | 520 | 650 | 550 |
| Width | 30 | 30 | 30 | 30 |
| Purity | 0.887 | 0.493 | 0.834 | 0.736 |

PHOSPHOR-CENTRIC CONTROL OF COLOR OF LIGHT

RELATED APPLICATIONS

This application is a Continuation of U.S. application Ser. No. 12/754,261 Filed Apr. 5, 2010, which claims the benefit of U.S. Provisional Application No. 61/304,560 Filed Feb. 15, 2010 entitled "Dynamic Control of Color Characteristics of Light Using Solid State Source and Phosphors," the disclosures of which also are entirely incorporated herein by reference.

TECHNICAL FIELD

The present subject matter relates to dynamically controlling or tuning color of light, for example, light produced by lighting systems including fixtures and lamps that utilize solid state sources to independently pump phosphors that provide substantially pure individual colors, so that the device enables adjustment of color of a combined light output, for example over a wide range of different selectable colors encompassing much of the gamut of visible light.

BACKGROUND

Recent years have seen a rapid expansion in the performance of solid state lighting emitters such as light emitting devices (LEDs); and with improved performance, there has been an attendant expansion in the variety of applications for such light sources. For example, rapid improvements in semiconductors and related manufacturing technologies are driving a trend in the lighting industry toward the use of light emitting diodes (LEDs) or other solid state light sources to produce light for general lighting applications to meet the need for more efficient lighting technologies and to address ever increasing costs of energy along with concerns about global warming due to consumption of fossil fuels to generate energy. LED solutions also are more environmentally friendly than competing technologies, such as compact fluorescent lamps, for replacements for traditional incandescent lamps.

Many solid state lighting systems have offered dynamic color control, however, the adjustment or tuning of the color of the output light has relied on LED centric approaches. Many solid state light sources produce light of specific limited spectral characteristics. To obtain light of a different color one approach uses solid sources that produce light of two or more different colors or wavelengths and one or more optical processing elements to combine or mix the light of the various wavelengths to produce the desired characteristic in the output light. One technique involves mixing or combining individual light from LEDs of three or more different wavelengths (spectral colors such as "primary" colors), for example from Red (R), Green (G) and Blue (B) LEDs. By selecting the relative intensities of the different sources, for example the amounts of red, green and blue light from the sources added to form the combined output light, it is possible to selectively produce light colors over a fairly substantial range of the visible spectrum.

With a LED-centric approach such as LED based RGB, the individual color amounts can be adjusted easily. However, using almost monochromatic colors from LEDs as the sources imposes limitations on overall performance. For example, with the approach using LEDs of three different very monochromatic colors, the output spectrum tends to have a small number of narrow spikes. For white light settings, this produces a low color rendering index (CRI) or otherwise inferior illumination of objects of certain colors where there is a gap in the output spectrum. Even for non-white settings, it may be difficult to produce an actual color output that really matches the desired spectral content because of the narrow spectrums combined to form the output, so that objects may take on unexpected hues when illuminated by such light outputs. It is possible to improve the light quality by providing additional LEDs of different colors, but that approach increases complexity and overall system cost and may still not achieve a desired high quality of light over a sufficient portion of the intended operating gamut.

There also have been a variety of proposals to enhance solid state light performance by adding appropriate phosphors to effectively shift some or all of the energy from the solid state source to a more desirable region of the spectrum. Although many such techniques are intended to provide white lighting, some have involved control, for example, to achieve and maintain a desired color characteristic of the white output light. For example, phosphor based techniques for generating white light from LEDs, currently favored by LED manufacturers, include UV or Blue LED pumped phosphors. In addition to traditional phosphors, semiconductor nanophosphors have been used more recently. The phosphor materials may be provided as part of the LED package (on or in close proximity to the actual semiconductor chip), or the phosphor materials may be provided remotely (e.g. on or in association with a macro optical processing element such as a diffuser or reflector outside the LED package). However, the tuning of the color or color temperature of the phosphor based approaches has still relied on dynamic control of different color LED sources. The phosphor emissions may be somewhat broader than those of the LEDs, and for example, might appear pastel or even substantially white. The controlled LEDs used for tuning may be specific color LEDs of one or more colors selected to adjust the light color characteristic of light produced by pumping of the phosphor. Like the LED-centric tuning of the substantially monochromatic LEDs, the LED centric tuning of the phosphor emissions may have some narrow spiking in the emission spectrum, and as a result, the range and quality of light color may still be less than desirable.

Solid state lighting technologies have advanced considerably in recent years, and such advances have encompassed any number of actual LED based products, however there is still room for further improvement in the context of lighting products. For example, it may be desirable for the solid state lighting device to provide a tunable color light output of color, however, there is still room for improvements in the range and/or quality of the tunable color light output. Relatively acceptable/pleasing form factors similar to those of well accepted lighting products also may be desirable, while maintaining advantages of solid state lighting, such as relatively high dependability, long life and efficient electrical drive of the solid state light emitters.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 2 is a simplified cross-sectional view of a light-emitting diode (LED) type solid state source, which may be used as the source in a tunable color solid state lighting device.

FIG. 3 is cross-sectional view of one light guide/container included in the tunable color light emitting device of FIG. 1A.

DETAILED DESCRIPTION

Figure 1:
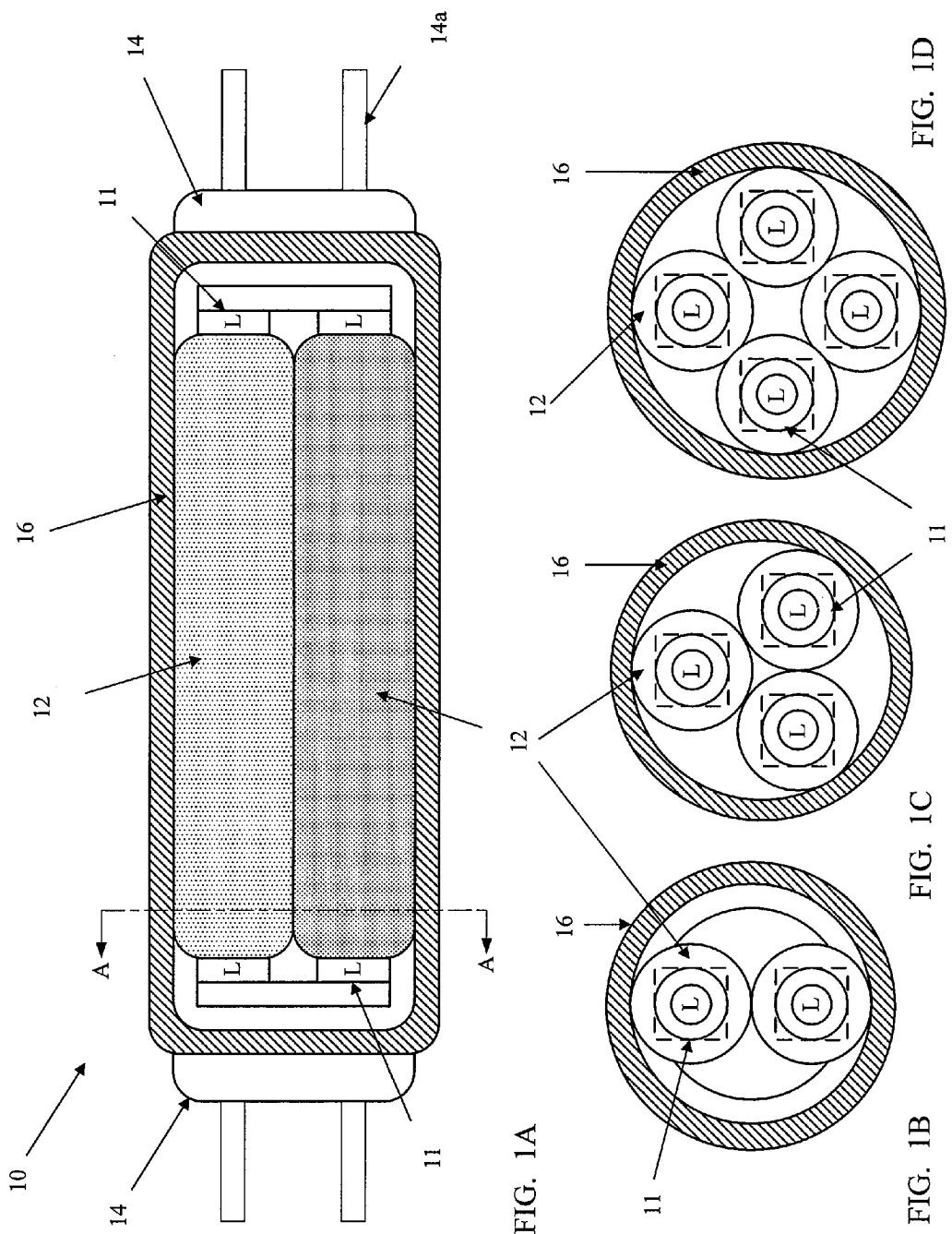
FIG. 1A is a cross-sectional view of a phosphor-centric tunable color light emitting device, with certain elements thereof shown in cross-section.
FIGS. 1B-1D are cross-sectional views of the tunable color light emitting device in FIG. 1A containing two, three and four light guides, respectively.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various technologies disclosed herein relate to variable color lighting devices and lighting systems using such devices. The examples offer tunable color control of light output of the devices or systems. The examples implement a phosphor-centric approach to color control that utilizes separately controllable sources with a particular emission spectrum to pump different phosphors emitting substantially pure individual colors. The phosphor-centric color control, at least in several of the examples, enables adjustment of color of a combined light output over a wide range of different selectable colors encompassing much of the gamut of visible light. The various phosphor-centric devices/systems may be or may be used in common lighting fixtures and lamps such as those for general lighting applications. Examples of general lighting applications include downlighting, task lighting, "wall wash" lighting, emergency egress lighting, as well as illumination of an object or person in a region or area intended to be occupied by one or more people.

In the specific examples shown in the drawings, the sources are solid state type sources, such as LEDs, although other sources of energy of the appropriate spectral characteristics for the phosphor pumping may be used. Although other types of solid state light emitters may be used, the illustrated examples use one or more LEDs to supply the energy to excite the phosphors. The solid state type source in such cases may be the collection of the LEDs. Alternatively, each LED may be considered a separate solid state source. Stated another way, a source may include one or more actual emitters.

In the examples, the sources are configured to emit light or other electromagnetic energy of the same spectrum, in that they are rated for the same spectral output, e.g. rated for the same main wavelength output, although in actual lighting devices there may be some variation from source to source for example within manufacturer's tolerances.

The sources and respective optical elements containing the different phosphors are arranged so that each source supplies electromagnetic energy to excite the phosphor in the respective optical element but supplies little or no electromagnetic energy to excite the phosphor in any other optical element. Stated another way, an optical element receives energy from an associated source to excite the phosphor in that element, but little or no energy from a source associated with any of the other optical elements. In actual practice, there may be some leakage or cross-talk of the pumping energy from one source over from one associated optical element to another optical element. However, the sources and optical elements are arranged to keep any such cross-talk of potential pumping energy sufficiently low as to enable a level of independent control of the phosphor excitations to allow the degree of light tuning necessary for a particular tunable lighting application. For a tunable color lighting application, for example, the optical separation needs only to be sufficient to provide control of color in the output of the desired range of different selectable colors, that is to say, so as to achieve the desired range of system color adjustment.

With that instruction, reference now is made in detail to the examples illustrated in the accompanying drawings and discussed below. The first example represents a lamp product, specifically, a tube lamp, although fixture examples are discussed later. Reference now is made in detail to the examples illustrated in the accompanying drawings and discussed below.

FIG. 1A illustrates a first example of a tunable color light emitting device 10. As discussed more later, electronic circuitry is combined with the device 10, to control the sources and thus control or tune the output. The combination of the light emitting device with the appropriate electronics forms a light emitting system. The device and/or the system may be configured for any lighting application where it is desirable to vary or adjust a color of the visible output light. For example, with the appropriate phosphors, control of the device might cause it to output a wide range of different colors, encompassing much of the gamut of visible light. Because of the color purity of phosphor emissions, the lamp may offer at least some color output hues of a high saturation comparable for example to neon lights. However, the device 10 has the capacity for adjustment of the color to output, to provide selectable white light as well as other color hues of high saturation.

Hence, such a system can selectively output light of a particular hue with relatively high color saturation. However, some settings will also result in a relatively white light output. Some white light settings may correspond to color temperature points along the black body curve (on or within some tolerance range of a point on that curve). Although sometimes referred to herein simply as white light for convenience, light produced by excitation of the phosphors in the device 10 may be considered "at least substantially" white when the device is tuned so that the output light would appear as visible white light to a human observer, although it may not be truly white in the electromagnetic sense in that it may exhibit some spikes or peaks and/or valleys or gaps across the relevant portion of the visible spectrum and/or may differ from a black body spectrum for white light.

The variable color light emitting device 10 includes a number of optical elements 12 comprising containers formed of an optically transmissive material and containing a material bearing a phosphor. The various elements are not drawn to scale but instead are sized in the drawings in a manner to facilitate review and understanding by the reader. As will become apparent from later discussion of this first example, each optical element forms an optical guide with respect to energy from one or more sources 11 but allows diffuse emission of light produced by emissions of the phosphor excited by the energy from the respective source.

The exemplary tunable color lighting device 10 includes respective sources 11 coupled to or otherwise associated the various optical elements 12 to supply pumping energy to excite the phosphors in the respective optical elements. The sources 11 are configured to emit light or other electromagnetic energy of the same spectrum, in that they are rated for the same spectral output, e.g. rated for the same main wavelength output, although in actual lighting devices there may be some variation from source to source for example within manufacturer's tolerances. At least a portion of the emission spectrum for the sources 11 falls within all of the absorption or excitation spectra of the phosphors 18 contained in the various light guides 12. Stated another way, the absorption or excitation spectra of the various phosphors will have at least some overlap, and at least a portion of the source emission spectrum such as the rated main wavelength of the emission spectrum for the sources 11 falls within that absorption spectra overlap.

As discussed more below, the absorption spectra of the exemplary phosphors in the materials 18 encompass UV and near UV portions of the electromagnetic spectrum. Those skilled in the art will be aware of other light sources that fall within the range of such absorption spectra, such as black light florescent lamps and UV florescent lamps. The examples utilize solid state devices as the sources. Solid state devices with appropriate emissions spectra are readily available and relatively easy to independently control.

The sources 11 and respective optical elements 12 containing the different phosphors 18 are arranged so that each source 11 supplies electromagnetic energy to excite the phosphor 18 in the respective optical element 12 but supplies little or no electromagnetic energy to excite the phosphor 18 in any other optical element 12. Stated another way, an optical element 18 receives energy from an associated source 11 to excite the phosphor in that element 12, but little or no energy from a source 11 associated with any of the other optical elements 12. In actual practice, there may be some leakage or cross-talk of the pumping energy from one source 11 over from one associated optical element 12 to another optical element 12. However, the sources 11 and optical elements 12 are arranged to keep any such cross-talk of potential pumping energy sufficiently low as to enable a level of independent control of the phosphor excitations to allow the degree of light tuning necessary for a particular tunable color lighting application of the device 10. For a tunable color lighting application, for example, the optical separation needs only to be sufficient to provide control of color in the output of the desired range of different selectable colors, that is to say, so as to achieve the desired range of color adjustment.

The exemplary tunable color light emitting device 10 of FIG. 1 therefore includes a solid state source 11 positioned at each end of each of a plurality of light guides 12. Two light guides 12 are illustrated in FIGS. 1A and 1B, three light guides are illustrated in FIG. 1C, and four light guides are illustrated in FIG. 1D. FIGS. 1B-1D are cross sections of the tunable white light emitting device 10 along line A-A but for variants thereof containing two, three and four light guides 12, respectively. The light guides 12 are housed within an outer container 16 in this example with end caps 14 and metal prongs 14a for insertion into a compatible light socket. The outer container 16 is similar to a florescent tube and may present a similar outer tubular form factor. The circuitry (not shown) used to drive the solid state sources 11 may be contained within the caps 14, although if the tube device 10 is configured for a fixture similar to that for a florescent lamp, then the circuitry would likely be contained in a separate ballast like housing. An example of suitable circuitry is described in further detail with respect to FIG. 12.

The example assumes a straight tube implementation, with the longitudinal main central section or "tubular portion" of each light guide 12 and the outer container 16 having cylindrical internal and external surfaces. Those skilled in the art will recognize, however, that other tubular shapes may be used, for the light guides and/or the container. The lateral cross-section, for example, could be oblong, rectangular, square or triangular, etc., instead of circular as shown in FIGS. 1B-1D. Also, the tubular light guides and outer container may be curved or bent along their lengths, for example, for some neon lamp replacement applications. Furthermore, the inner and outer surfaces of any tube may converge or diverge somewhat, either laterally or longitudinally.

The lighting device 10 utilizes solid state sources 11, rated for emitting electromagnetic energy of a first emission spectrum, in the examples, at a wavelength in the range of 460 nm and below ($\lambda \leq 460$ nm). The solid state sources 11 in FIGS. 1A-1D can include near ultraviolet (UV) solid state sources, containing a semiconductor chip for producing near UV electromagnetic energy in a range of 380-420 nm. A semiconductor chip produces electromagnetic energy in the appropriate wavelength range, e.g. at 405 nm which is in the near ultraviolet (UV) range of 380-420 nm. Phosphors are remotely positioned in the light guide type containers 12 so as to be excited by this energy from the solid state sources 11. The phosphors are of types or configurations such that they are excited by energy in a range that includes the emission spectrum of the sources 11, and such that the phosphors together produce light in the output of the device 10 of a selected color within the gamut encompassed by the points represented by the pure color outputs of the particular number phosphors used in the device, where the output color is selected based on intensity levels of the phosphor outputs and thus relative intensity of pumping energies supplied by the various sources.

Several examples utilize doped semiconductor nanophosphors. The upper limits of the absorption spectra of the exemplary nanophosphors are all at or below 460 nm, for example, around 430 nm although phosphors with somewhat higher upper limits of their absorption spectra are contemplated. Other types of semiconductor nanophosphors, nanophosphors or regular phosphors may be used, and many suitable phosphors of these other types may have absorption spectra at or below 460 nm. A more detailed description of several examples of phosphor materials that can be used is provided later. The system incorporating the device 10 could use LEDs or other solid state devices emitting in the UV range, the near UV range or a bit higher, say up to around or about 460 nm. For discussion purposes, we will assume that the emission spectrum of the sources in the near UV range of 380-420 nm, say 405 nm LEDs.

To provide readers a full understanding, it may help to consider a simplified example of the structure of a solid state source 11, such as a near UV LED type solid state source. FIG. 2 illustrates a simple example of a near UV LED type solid state source 11, in cross section. In the example of FIG. 2, the source 11 includes at least one semiconductor chip, each comprising two or more semiconductor layers 13, 15 forming the actual LED. The semiconductor layers 13, 15 of the chip are mounted on an internal reflective cup 17, formed as an extension of a first electrode, e.g. the cathode 19. The cathode 19 and an anode 21 provide electrical connections to layers of the semiconductor chip device within the packaging for the source 11. In the example, an epoxy dome 23 (or similar transmissive part) of the enclosure allows for emission of the electromagnetic energy from the chip in the desired direction.

In this simple example, the solid state source 11 also includes a housing 25 that completes the packaging/enclosure for the source. Typically, the housing 25 is metal, e.g. to provide good heat conductivity so as to facilitate dissipation of heat generated during operation of the LED. Internal "micro" reflectors, such as the reflective cup 17, direct energy in the desired direction and reduce internal losses. Although one or more elements in the package, such as the reflector 17 or dome 23 may be doped or coated with phosphor materials, phosphor integrated in (on or within) the package is not required for remote phosphor or remote semiconductor nanophosphor implementations as discussed herein. The point here at this stage of our discussion is that the solid state source 11 is rated to emit near UV electromagnetic energy of a wavelength range at or below 460 nm, such as in the 380-420 nm range—specifically at 405 nm in the illustrated example.

Semiconductor devices such as the solid state source 11 exhibit emission spectra having a relatively narrow peak at a predominant wavelength, although some such devices may have a number of peaks in their emission spectra. Often, manufacturers rate such devices with respect to the intended wavelength of the predominant peak, although there is some variation or tolerance around the rated value, from device to device. For example, the solid state source 11 in the example of FIGS. 1A-1D and 2 is rated for a 405 nm output, which means that it has a predominant peak in its emission spectra at or about 405 nm (within the manufacturer's tolerance range of that rated wavelength value). However, other devices that have additional peaks in their emission spectra can be used in the examples described herein.

The structural configuration of the solid state source 11 shown in FIG. 2 is presented here by way of example only. Those skilled in the art will appreciate that any solid state light emitting sources can be used, and the present teachings are not limited to near UV LEDs. Blue LEDs may also be used, and LEDs or the like producing other colors of visible light may be used if the phosphors selected for a particular implementation absorb light of those colors. UV LEDs also may be used. In the example of FIG. 2, the LED device is configured as a source of 380-420 nm near UV range electromagnetic energy, for example, having substantial energy emissions in that range such as a predominant peak at or about 405 nm.

As discussed herein, applicable solid state light emitting elements or sources essentially include any of a wide range of light emitting or generating devices formed from organic or inorganic semiconductor materials. Examples of solid state light emitting elements include semiconductor laser devices and the like. Many common examples of solid state sources, however, are classified as types of "light emitting diodes" or "LEDs." This exemplary class of solid state sources encompasses any and all types of semiconductor diode devices that are capable of receiving an electrical signal and producing a responsive output of electromagnetic energy. Thus, the term "LED" should be understood to include light emitting diodes of all types, light emitting polymers, organic diodes, and the like. LEDs may be individually packaged, as in the illustrated examples. Of course, LED based devices may be used that include a plurality of LEDs within one package, for example, multi-die LEDs having two, three or more LEDs within one package. Those skilled in the art will recognize that "LED" terminology does not restrict the source to any particular type of package for the LED type source. Such terms encompass LED devices that may be packaged or non-packaged, chip on board LEDs, surface mount LEDs, and any other configuration of the semiconductor diode device that emits light. Solid state sources may include one or more phosphors and/or quantum dots, which are integrated into elements of the package or light processing elements of the fixture to convert at least some radiant energy to a different more desirable wavelength or range of wavelengths.

Returning to FIG. 1A, the tunable color lighting device 10 allows for the changing of intensity of emission of visible light by one of more phosphors contained in each light guide 12. Changing the intensity of energy that the respective sources supply to the different light guides 12 changes the respective pumping energy supplied to the phosphors contained in the light guides, which in turn changes the levels of excitation and thus changes the respective intensities of the emissions of the excited phosphors. The color or spectrum of energy of the emissions from the solid state source 11 for every light guide is essentially the same (same rating although there may be variations with manufacturers' tolerances), but the phosphor(s) contained in the light guides differ from one light guide to the next. The changing of intensity of a phosphor emission will now be described with reference to FIG. 3.

FIG. 3 shows one of the light guide/phosphor containing optical elements of the tunable color light emitting device 10. In the example of FIG. 3, two solid state sources 11 are optically coupled to the ends of light guide 12, although in this case, not via direct contact or index matched coupling. The end surfaces 20 of the light guide are specular surfaces facing back inside the light guide 12. End surfaces 20a positioned between specular surfaces 20 are made of glass or acrylic and allow light emitted from the solid state sources 11 to pass into the light guide 12. The light guide 12 is formed of a light transmissive material having an index of refraction that is higher than that of the ambient environment, typically air. The element 12 is configured so that most light from the sources passes axially through the element or at most is directed toward a side of the element 12 at a relatively shallow angle with respect to the sidewall of the element. As a result, total internal reflection (TIR) from the side surface(s) can be realized with the positioning of the solid state sources in the opening between specular surfaces 20. Hence, electromagnetic energy of the first emission spectrum from the sources 11 will pass and reflect back and forth within the element 12, but relatively little of that energy will emerge through the sidewall(s) of the optical element. Stated another way, the optical element 12 is configured and coupled to each source 11 so as to receive energy from the source and act as a light guide with respect to the energy received from the source.

In the examples of FIGS. 1A-1D and 3, the light guides 12 are tubular. Those skilled in the art will recognize that the tubular light guides may be made of a variety of materials/structures having the desired optical properties. For example, each light guide 12 could be made from a 3M™ Light Pipe, which is filled with a phosphor bearing material 18 and appropriately sealed at both ends. The ends sealing the tube would have the reflective coating 20 and the transmissive section 20a, like those of FIG. 3. As manufactured by 3M™, a Light Pipe is a transparent tube lined with 3M™ Optical Lighting Film, which is a micro-replicated prismatic film. The film is transmissive with respect to light striking the surface of the film at steep angles, but it is highly reflective to light striking the surface of the film at shallow angles. In a light guide 12 implemented using the 3M™ a Light Pipe, light emitted by the LEDs 11 which strikes the film reflects back into the interior of the light guide and tends to travel along the length of the light guide 12. If not absorbed by a phosphor particle in the material 18 contained within the light guide 12, the light may reflect back from the reflector 20a on the opposite tube end and travel the length of the light guide again, with one or more reflections off the film lining the interior tube surface. However, light generated by phosphor excitations within the light guide 12 impacts the film at steeper angles, and the film allows relatively uniform release along the length of the light guide 12.

A variety of conventional phosphors may be contained in the light guides 12 in the form of a solid, a liquid or a gas. Also, recently developed quantum dot (Q-dot) phosphors or doped quantum dot (D-dot) phosphors may be used. Phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. Quantum dots (Q-dots) provide similar shifts in wavelengths of light. Quantum dots are nano scale semiconductor particles, typically crystalline in nature, which absorb light of one wavelength and re-emit light at a different wavelength, much like conventional phosphors. However, unlike conventional phosphors, optical properties of the quantum dots can be more easily tailored, for example, as a function of the size of the dots. In this way, for example, it is possible to adjust the absorption spectrum and/or the emission spectrum of the quantum dots by controlling crystal formation during the manufacturing process so as to change the size of the quantum dots. Thus, quantum dots of the same material, but with different sizes, can absorb and/or emit light of different colors. For at least some exemplary quantum dot materials, the larger the dots, the redder the spectrum of re-emitted light; whereas smaller dots produce a bluer spectrum of re-emitted light. Doped quantum dot (D-dot) phosphors are similar to quantum dots but are also doped in a manner similar to doping of a semiconductor. Also, Colloidal Q-Dots are commercially available from NN Labs of Fayetteville, Ark. and are based upon cadmium selenide. Doped semiconductor nanophosphors are commercially available from NN Labs of Fayetteville, Ark. and are based upon manganese or copper-doped zinc selenide and can be used with UV or near UV solid state emitters (e.g. LEDs).

The phosphors may be provided in the form of an ink or a paint. In FIG. 3, the one or more phosphors 18 are included within the light guide 12. The phosphor 18 is positioned between the solid state emitters 11 within the light guide 12. The phosphor material 18 can be a solid, a liquid or a gas contained within the light guide 12, for example, in the form of a bearer material in an internal volume of the container/light guide with the respective phosphor dispersed in that bearer material. The bearer medium preferably is highly transmissive and/or has low absorption to light of the relevant wavelengths. Clear or translucent materials may be used. Although alcohol, vegetable oil or other media may be used, the medium or bearer material may be a silicon material. If silicone is used, it may be in gel form or cured into a hardened form in the finished lighting device product. Another example of a suitable material, having D-dot type phosphors in a silicone medium, is available from NN Labs of Fayetteville, Ark. A Q-Dot product, applicable as an ink or paint, is available from QD Vision of Watertown Mass.

Each light guide 12 contains a different phosphor. Individual phosphors or combinations thereof may be used in each light guide 12 to produce a relatively pure or monochromatic light of different colors. At least in a device using three (FIG. 1C), four (FIG. 1D) or more phosphors in respective containers/light guides, the device 10 can be controlled to provide a wide range of different selectable colors, encompassing much of the gamut of visible light, by controlling relative different color emission levels of the different phosphors in the different light guides 12.

For further discussion of this example, we will assume that the each light guide 12 forms a container filled with a gaseous or liquid material bearing a different one or more phosphors dispersed therein, where the phosphor(s) in each respective light guide 12, when excited, produces visible light of different respective color emission spectrum that is at least substantially pure. Tri-color examples might utilize a red (R) emitting phosphor in one light guide 12, a green (G) emitting phosphor in another light guide 12 and a blue (B) emitting phosphor the third light guide 12. A four-color example might use RGB plus another phosphor for emitting another pure color of visible light. Of course combinations of phosphors for emitting other three, four or more colors may be used in a corresponding numbers of light guides. Also, for further discussion, we will assume that the solid state source 11 is a near UV emitting LED, such as a 405 nm LED or other type of LED rated to emit somewhere in the wavelength range of 380-420 nm. In any case, each phosphor is of a type excited in response to at least the near UV electromagnetic energy from the LED or LEDs 11 forming the solid state source in our example.

When so excited, each phosphor in the tunable lighting device 10 re-emits visible light of a different relatively pure color. At least in examples using semiconductor nanophosphors, particularly doped semiconductor nanophosphors, each such emission spectrum has substantially no overlap with absorption spectra of the particular phosphors. As will be discussed more later, the emission spectra of the phosphors are relative pure or monochromatic colors of light, as compared to relatively broad spectra as might be used if the device were intended to produce tunable white light outputs. However, even the relatively pure emission spectra for the variable color light output devices tend to be somewhat broader than the narrow spectrum emissions from the LEDs 11. When excited to various selected levels by the selectable levels of electromagnetic energy received from the different LED sources 11, the phosphors together produce visible light output for the device 10 of a desired color within the operating gamut encompassed by the points corresponding to the individual phosphor emissions. At least in examples of lighting devices using three, four or more containers 12 with respectively different pure color emitting phosphors, such devices can selectively output combined light output of a wide range of different selectable colors encompassing much of the gamut of visible light.

To appreciate the use of phosphors producing substantially pure color emissions when excited, it may be helpful to consider some examples. FIGS. 4-6 represent simulations with regard to color performance. The simulations are structured for ease of illustration and understanding of points considered herein, however, it is believed that there are a variety of types of phosphors available that would exhibit fairly similar performance and could be used to provide fairly similar color tuning performance in a lighting device like any of those disclosed herein.

Figures 4A, 4B:
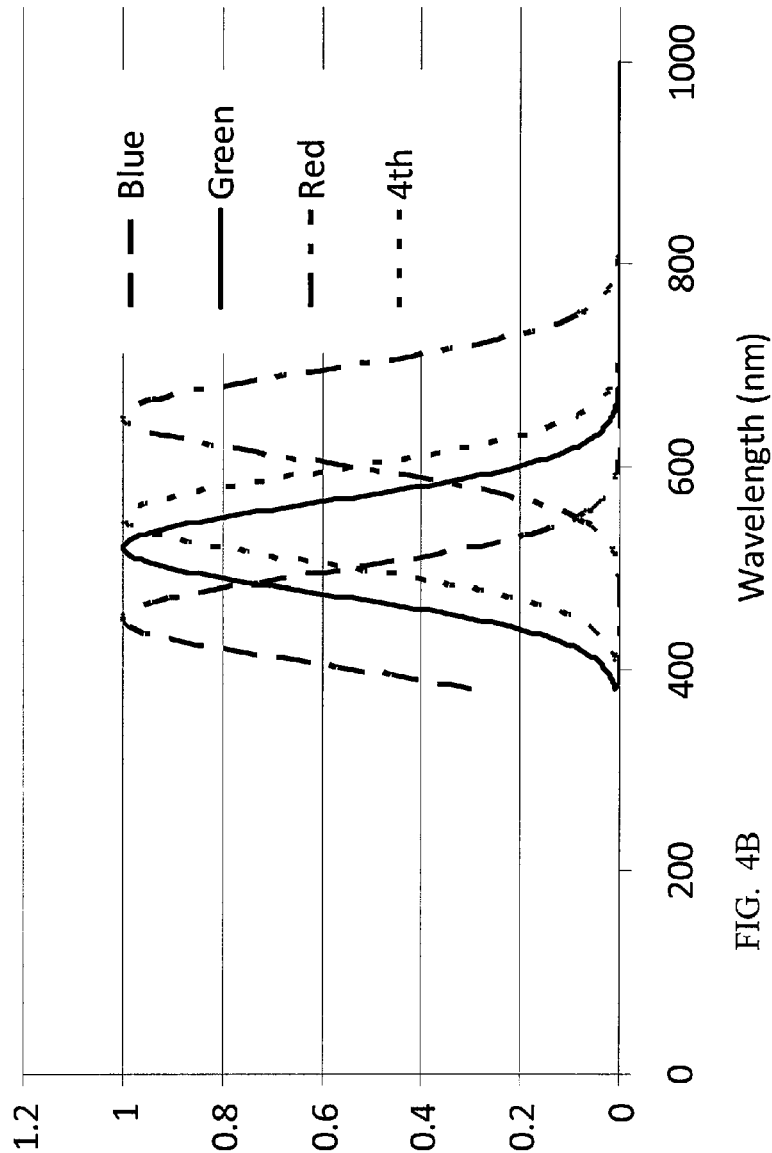
FIGS. 4A, 4B and 4C show certain data, the different phosphor emissions spectra and the vertices of the operating gamut within the CIE color chart for the visible light gamut, for a first simulation of four types of phosphor color emissions of first examples of color purity.
Figure 4C:
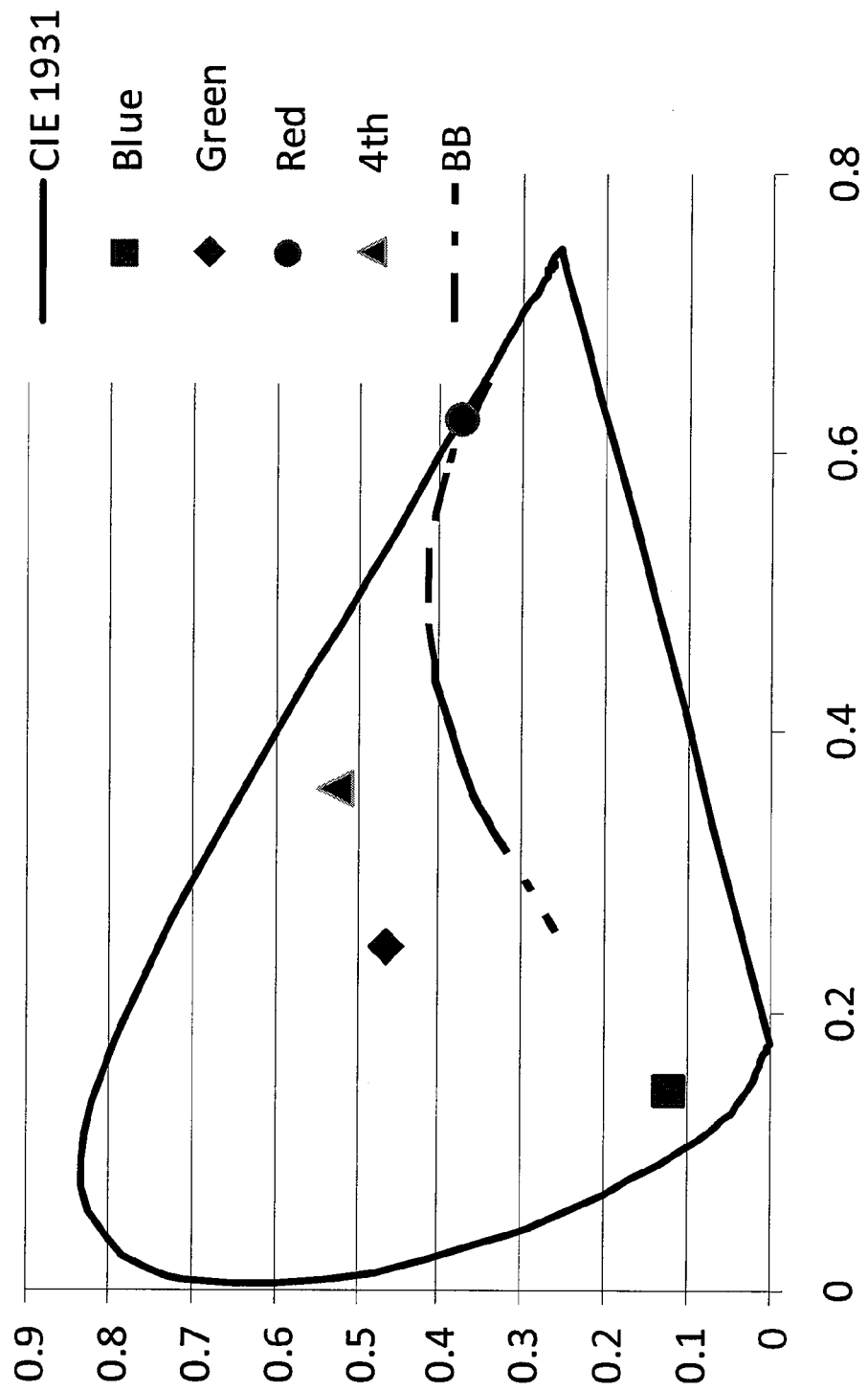
Figures 5A, 5B:
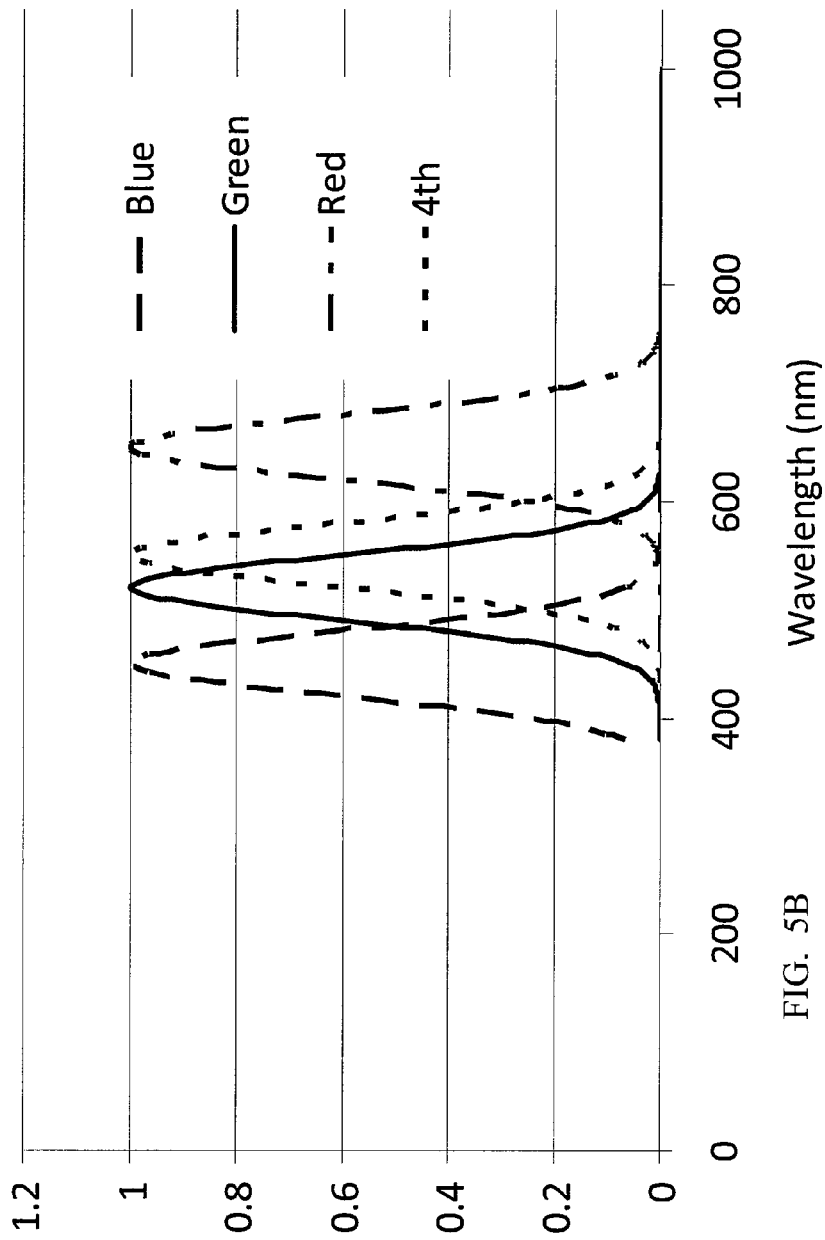
FIGS. 5A, 5B and 5C show certain data, the different phosphor emissions spectra and the vertices of the operating gamut within the CIE color chart for the visible light gamut, for a second simulation of four types of phosphor color emissions of second examples of color purity (purer than the first examples).
Figure 5C:
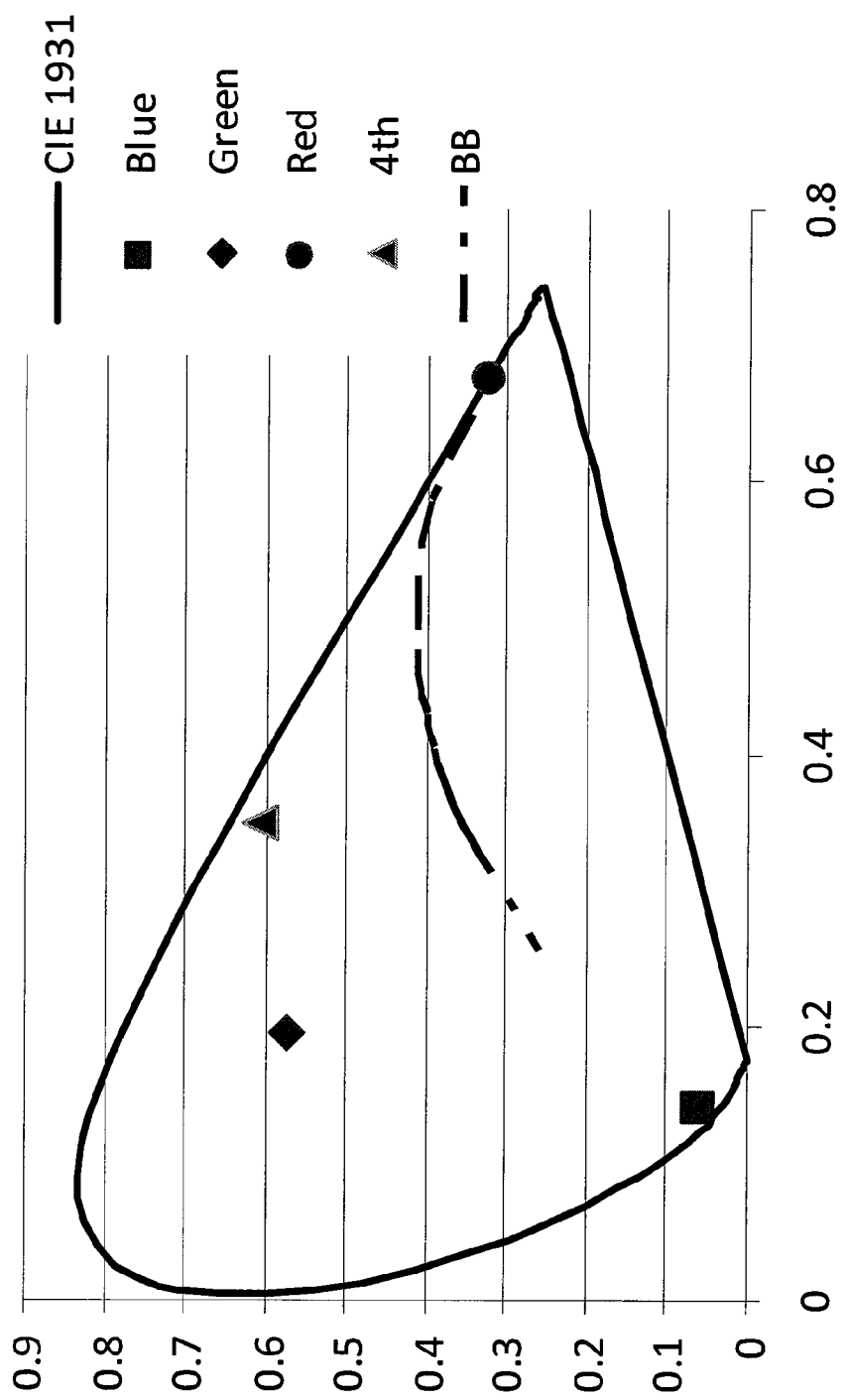
Figures 6A, 6B:
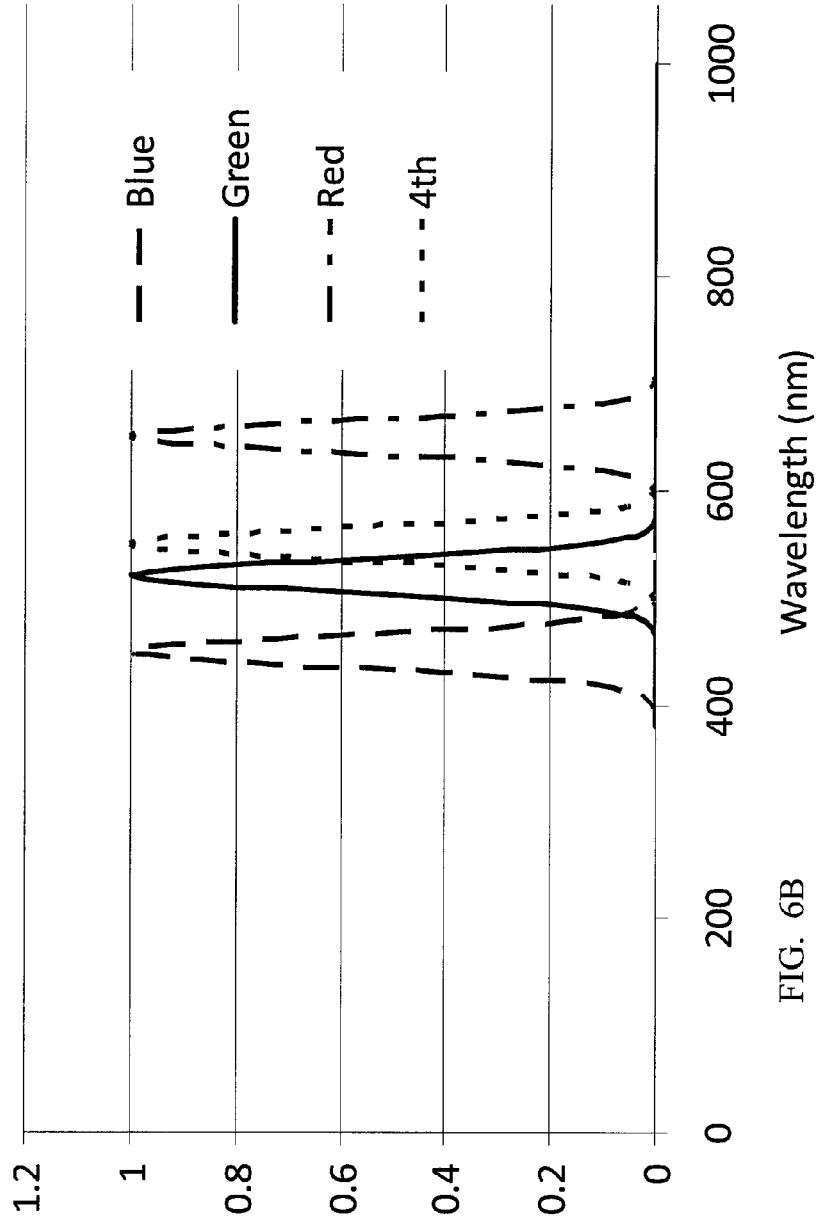
FIGS. 6A, 6B and 6C show certain data, the different phosphor emissions spectra and the vertices of the operating gamut within the CIE color chart for the visible light gamut, for a third simulation of four types of phosphor color emissions of third examples of color purity (purer than the first and second examples).
Figure 6C:
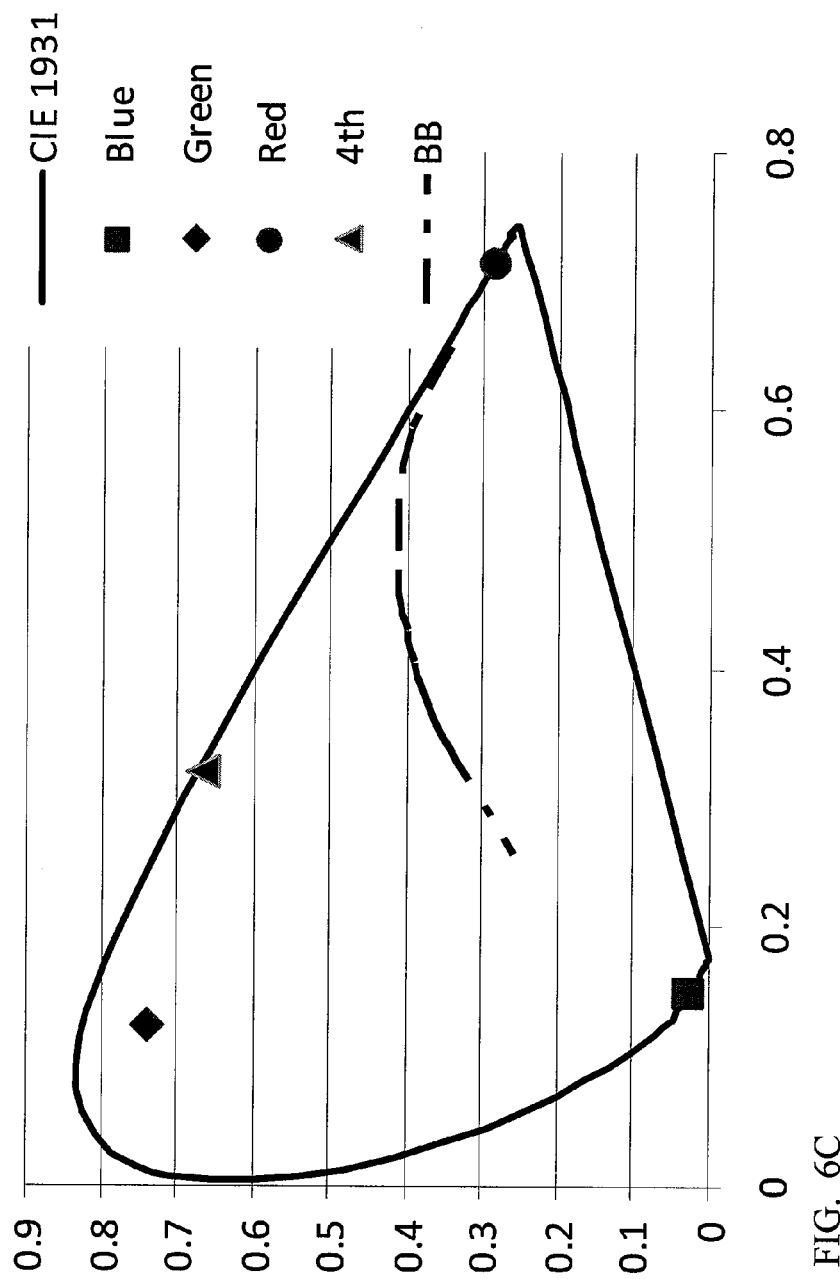

The drawings simulate three different examples of sets of phosphors with different degrees or levels of purity of the color output, with FIGS. 4A-4C representing a lower set of levels of color purity, FIGS. 5A-5C representing a middle set of levels of color purity, and FIGS. 6A-6C representing a higher set of levels of color purity. In these examples, we will assume the use of four phosphors, a red (R) emitting phosphor, a green (G) emitting phosphor, a blue (B) emitting phosphor, and a fourth color phosphor.

FIG. 4A is a table showing some of the data of the first simulation. The red (R) phosphor exhibits an emission peak at or around 650 nm, the green (G) phosphor exhibits an emission peak at or around 520 nm, the blue (B) phosphor exhibits an emission peak at or around 450 nm, and the fourth color phosphor exhibits an emission peak at or around 550 nm (between the peaks for the green and red emissions).

FIG. 4B shows the simulated emission spectra of the four phosphors. For simulation purposes, we have assumed that each phosphor emission spectra takes the form of a regular bell-shaped curve, for ease of illustration and discussion. Each bell-shaped emission spectra has a width, corresponding to one standard deviation. As shown in the table of FIG. 4A, in this first example, we have assumed that emission spectra of the four phosphors all have a width of 45 nm. FIG. 4B in turn shows the four bell shaped emission spectra simulated to have widths of 45 nm.

The last line of the table of FIG. 4A in turn shows the color purity for the colors of the four phosphor emissions in this first exemplary simulation. As shown, the red (R) phosphor exhibits color purity of 0.678, the green (G) phosphor exhibits a color purity of 0.279, the blue (B) phosphor exhibits a color purity of 0.731, and the fourth color phosphor exhibits a color purity of 0.532.

FIG. 4C shows the CIE color chart with the black body curve; and on that chart, the drawing shows the color points corresponding to the four color emissions of the width and color purities of FIGS. 4A and 4B. The four points represent the vertices of the operating gamut of combined color outputs that may be achieved by variable intensity excitations of phosphors exhibiting emissions spectra like those of FIG. 4B. The CIE chart (outer curved boundary) represents the gamut of light color visible to humans. Stated another way, with phosphors producing emissions of spectra approximating those in the simulation, a lighting device can selectively output substantially any color on or inside a four sided polygon on the chart bounded/defined by the four color vertices.

For example, a lighting device using phosphors having emission spectra approximating the simulations of FIGS. 4A to 4C would be able to produce colors corresponding to the four points. With the sources for pumping the other three phosphors off, the device would output only red (R) phosphor emission, with the exemplary bell-shaped spectrum centered on the peak at or around 650 nm in FIG. 4B, which corresponds to the circular vertex on the CIE chart in FIG. 4C. Similarly, with the sources for pumping the other three phosphors off, the device would output only green (G) phosphor emission centered on a peak at or around 520 nm in FIG. 4B, which corresponds to the diamond-shaped vertex on the CIE chart in FIG. 4C. With the sources for pumping the other three phosphors off, the device would output only blue (B) phosphor emission centered around a peak at or around 450 nm in FIG. 4B, which corresponds to the square-shaped vertex on the CIE chart in FIG. 4C. Similarly, with the sources for pumping the other three phosphors off, the device would output only the fourth color phosphor emission centered around a peak at or around 550 nm in FIG. 4B, which corresponds to the triangular vertex on the CIE chart in FIG. 4C. Other settings with two, three or four of the phosphors pumped to various excitations levels would result in color light output at various points on the chart within the boundary of the polygon defined by the four color vertices.

As shown, the vertices in the example of FIG. 4C surround a middle section of the visible color gamut, including the black body curve. Points on or around the black body curve represent many color conditions that a person would perceive as white. Hence, a lighting device using phosphors having emission spectra approximating the simulations of FIGS. 4A to 4C would be able to produce a range of white light of various color temperatures on or around points on the black body curve. However, such a lighting device would also be able to produce a range of colors that would likely not be perceived as white. Points out closer to the edge of the color chart would have a more specific hue and would appear more saturated to a human observer.

FIGS. 5A, 5B and 5C show similar data, phosphor emissions spectra and vertices of the operating gamut within the CIE color chart for the visible light gamut, for a different set of four simulated phosphor emissions. Of note, this second set of simulated phosphor emissions has the same colors/wavelengths for the four phosphor emissions, but for this example, we assumed that each bell-shaped emission spectra has a width, corresponding to one standard deviation, of 30 nm (see FIG. 5A). FIG. 5B in turn shows the four bell shaped emission spectra simulated to have widths of 30 nm, that is to say, clearly narrower than the emission spectra depicted in FIG. 4B.

The last line of the table of FIG. 5A in turn shows the color purity for the colors of the four phosphor emissions in this first exemplary simulation. As shown, the red (R) phosphor exhibits color purity of 0.834, the green (G) phosphor exhibits a color purity of 0.493, the blue (B) phosphor exhibits a color purity of 0.887, and the fourth color phosphor exhibits a color purity of 0.736. As shown by comparison of the data of FIGS. 4A and 5A, the second set of phosphor emissions exhibiting the narrower emissions spectra represents purer color emissions.

FIG. 5C shows the CIE color chart with the black body curve; and on that chart, the drawing shows the color points corresponding to the four color emissions of the width and color purities of FIGS. 5A and 5B. Again, the four points represent the vertices of the operating gamut of combined color outputs that may be achieved by variable intensity excitations of phosphors exhibiting emissions spectra like those of FIG. 5B. The CIE chart (outer curved boundary) represents the gamut of light color visible to humans. Stated another way, with phosphors producing emissions of spectra approximating those in the simulation, a lighting device can selectively output substantially any color on or inside a four sided polygon on the chart bounded/defined by the four color vertices.

A lighting device using phosphors having emission spectra approximating the simulations of FIGS. 5A to 5C would be able to produce colors corresponding to the four points. As can be seen by comparing FIG. 5C to earlier FIG. 4C, as the phosphor emission spectra become more pure, the spectra from the phosphor emissions effectively move out closer to the edges of the CIE color chart. This effectively expands the operating gamut of the device using such phosphors to encompass more of the visible light gamut represented by the outer boundary on the CIE color chart. Such devices can selectively output combined light of a wide range of different selectable colors encompassing much of the gamut of visible light.

With the sources for pumping the other three phosphors off, the device would output only red (R) phosphor emission, with the exemplary bell-shaped spectrum centered on the peak at or around 650 nm in FIG. 5B, which corresponds to the circular vertex on the CIE chart in FIG. 5C. Similarly, with the sources for pumping the other three phosphors off, the device would output only green (G) phosphor emission centered on a peak at or around 520 nm in FIG. 5B, which corresponds to the diamond-shaped vertex on the CIE chart in FIG. 5C. With the sources for pumping the other three phosphors off, the device would output only blue (B) phosphor emission centered around a peak at or around 450 nm in FIG. 5B, which corresponds to the square-shaped vertex on the CIE chart in FIG. 5C. Similarly, with the sources for pumping the other three phosphors off, the device would output only the fourth color phosphor emission centered around a peak at or around 550 nm in FIG. 5B, which corresponds to the triangular vertex on the CIE chart in FIG. 5C. Other settings with two, three or four of the phosphors pumped to various excitations levels would result in color light output at various points on the chart within the boundary of the polygon defined by the four color vertices.

Again, the vertices in the example of FIG. 5C surround a middle section of the visible color gamut, including the black body curve. Points on or around the black body curve represent many color conditions that a person would perceive as white. Hence, a lighting device using phosphors having emission spectra approximating the simulations of FIGS. 5A to 5C would be able to produce a range of white light of various color temperatures on or around points on the black body curve. However, such a lighting device would also be able to produce a range of colors that would likely not be perceived as white. Points out closer to the edge of the color chart would have a more specific hue and would appear more saturated to a human observer. In that regard, the vertices in the example of FIG. 5C define an operating gamut of the device covering a wider range of visible colors, including more of the highly saturated colors out nearer the boundary of the visible spectrum.

FIGS. 6A, 6B and 6C show similar data, phosphor emissions spectra and vertices of the operating gamut within the CIE color chart for the visible light gamut, for another set of four simulated phosphor emissions. Of note, this third set of simulated phosphor emissions has the same colors/wavelengths for the four phosphor emissions, but for this example, we assumed that each bell-shaped emission spectra has a width, corresponding to one standard deviation, of 15 nm (see FIG. 6A). FIG. 6B in turn shows the four bell shaped emission spectra simulated to have widths of 30 nm, that is to say, clearly narrower than the emission spectra depicted in FIG. 4B or 5B.

The last line of the table of FIG. 6A in turn shows the color purity for the colors of the four phosphor emissions in this first exemplary simulation. As shown, the red (R) phosphor exhibits color purity of 0.960, the green (G) phosphor exhibits a color purity of 0.815, the blue (B) phosphor exhibits a color purity of 0.977, and the fourth color phosphor exhibits a color purity of 0.919. As shown by comparison of the data of FIGS. 4A and 6A, the third set of phosphor emissions exhibiting the narrower emissions spectra represents purer color emissions.

FIG. 6C shows the CIE color chart with the black body curve; and on that chart, the drawing shows the color points corresponding to the four color emissions of the width and color purities of FIGS. 6A and 6B. Again, the four points represent the vertices of the operating gamut of combined color outputs that may be achieved by variable intensity excitations of phosphors exhibiting emissions spectra like those of FIG. 6B. The CIE chart (outer curved boundary) represents the gamut of light color visible to humans. Stated another way, with phosphors producing emissions of spectra approximating those in the simulation, a lighting device can selectively output substantially any color on or inside a four sided polygon on the chart bounded/defined by the four color vertices.

A lighting device using phosphors having emission spectra approximating the simulations of FIGS. 6A to 6C would be able to produce colors corresponding to the four points. With the sources for pumping the other three phosphors off, the device would output only red (R) phosphor emission, with the exemplary bell-shaped spectrum centered on the peak at or around 650 nm in FIG. 6B, which corresponds to the circular vertex on the CIE chart in FIG. 6C. Similarly, with the sources for pumping the other three phosphors off, the device would output only green (G) phosphor emission centered on a peak at or around 520 nm in FIG. 6B, which corresponds to the diamond-shaped vertex on the CIE chart in FIG. 6C. With the sources for pumping the other three phosphors off, the device would output only blue (B) phosphor emission centered around a peak at or around 450 nm in FIG. 6B, which corresponds to the square-shaped vertex on the CIE chart in FIG. 6C. Similarly, with the sources for pumping the other three phosphors off, the device would output only the fourth color phosphor emission centered around a peak at or around 550 nm in FIG. 6B, which corresponds to the triangular vertex on the CIE chart in FIG. 6C. Other settings with two, three or four of the phosphors pumped to various excitations levels would result in color light output at various points on the chart within the boundary of the polygon defined by the four color vertices.

As can be seen by comparing FIG. 6C to earlier FIGS. 4C and 5C, as the phosphor emission spectra become more pure, the spectra from the phosphor emissions effectively move out closer to the edges of the CIE color chart. In the example of FIG. 6C, the red and blue are out on or near a point on the outer boundary of the visible gamut of the CIE color chart. The fourth color also is near a point on the outer boundary of the visible gamut of the CIE color chart. Even the blue vertex is out nearer the edge of the visible light gamut than in the earlier examples.

As shown by the comparison to the earlier charts, the increased purity of the emission colors further expands the operating gamut of the device using such phosphors to encompass more of the visible light gamut represented by the outer boundary on the CIE color chart. Again, the vertices in the example of FIG. 6C surround a middle section of the visible color gamut, including the black body curve. Points on or around the black body curve represent many color conditions that a person would perceive as white. Hence, a lighting device using phosphors having emission spectra approximating the simulations of FIGS. 6A to 6C would be able to produce a range of white light of various color temperatures on or around points on the black body curve. However, such a lighting device would also be able to produce a range of colors that would likely not be perceived as white. Such devices can selectively output combined light of a wide range of different selectable colors encompassing much of the gamut of visible light. Points out closer to the edge of the color chart would have a more specific hue and would appear more saturated to a human observer. In that regard, the vertices in the example of FIG. 6C define an operating gamut of the device covering a high percentage of the visible colors, including many highly saturated colors out near the boundary of the visible spectrum.

As noted earlier, FIGS. 4-6 represent simulated phosphor emissions. However, phosphors, nanophosphors, semiconductor nanophosphors and doped semiconductor nanophosphors are available; and many such phosphors may be chosen and used in light guides or other container elements in a lighting device like 10 that can achieve performance generally similar to that of one or more of the simulations of FIGS. 4-6.

Figure 7A:
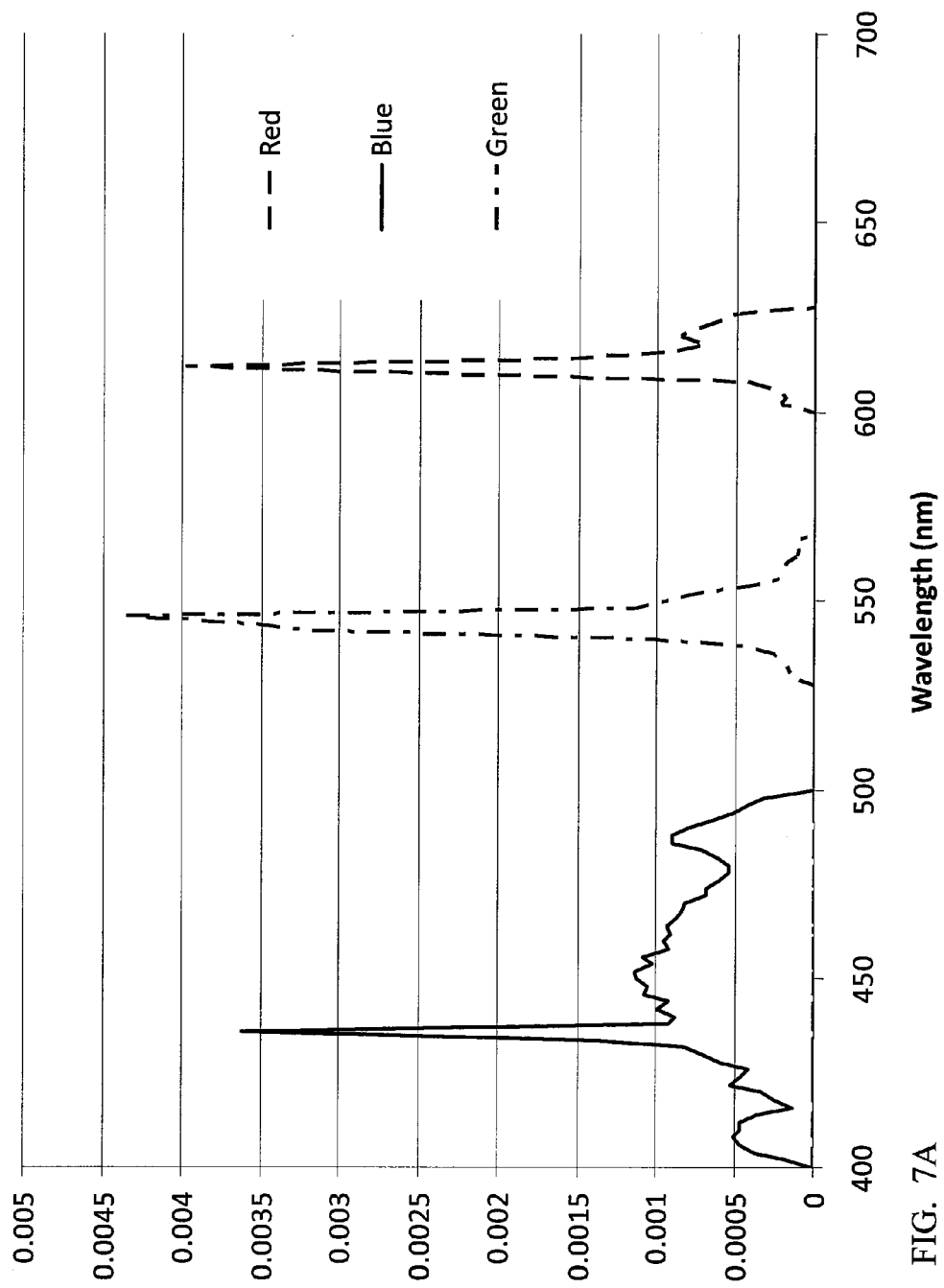
FIG. 7A depicts measured spectra of emissions from three exemplary phosphors, in this case, for red (R), green (G) and blue (B) emissions.

FIG. 7A depicts measured spectra of emissions from three exemplary phosphors, in this case, for red (R), green (G) and blue (B) emissions. For convenience, the measurements of phosphor emissions were taken from a flat screen monitor using a spectrometer. The monitor was driven to emit only red (R), while the spectrometer measured the spectrum of the output. Similarly, the monitor was driven to emit only green (G), while the spectrometer measured the spectrum of the output; and the monitor was driven to emit only blue (B) while the spectrometer measured the spectrum of the output. However, the spectra for RGB emissions shown in FIG. 7A represent actual measured data of commercially available phosphors, and such phosphors are among the broad general class of phosphors having sufficiently pure emission spectra to enable their used in the variable color lighting devices discussed herein.

The scale of the drawing in FIG. 7A is somewhat larger than used in FIGS. 4B, 5B and 6B. As shown, the spectra are not as uniform as in the simulations but still generally can be viewed as centered around a particular wavelength. For example, the blue phosphor emission spectrum is roughly centered around 450 nm, although there is a narrow spike somewhat below 450 nm. The blue emission spectrum runs from 400 to 500 nm. The green emission spectrum in this example runs from about 530 up to around 565 nm, with a pronounced central peak at about 545 nm. The red emission spectrum in this example runs from 600 up to around 630 nm, with a pronounced central peak at about 615 nm. As shown, the green and red emission spectra are quite narrow. The blue emission spectrum is somewhat broader, but even that spectrum has a very narrow main peak.

Figure 7B:
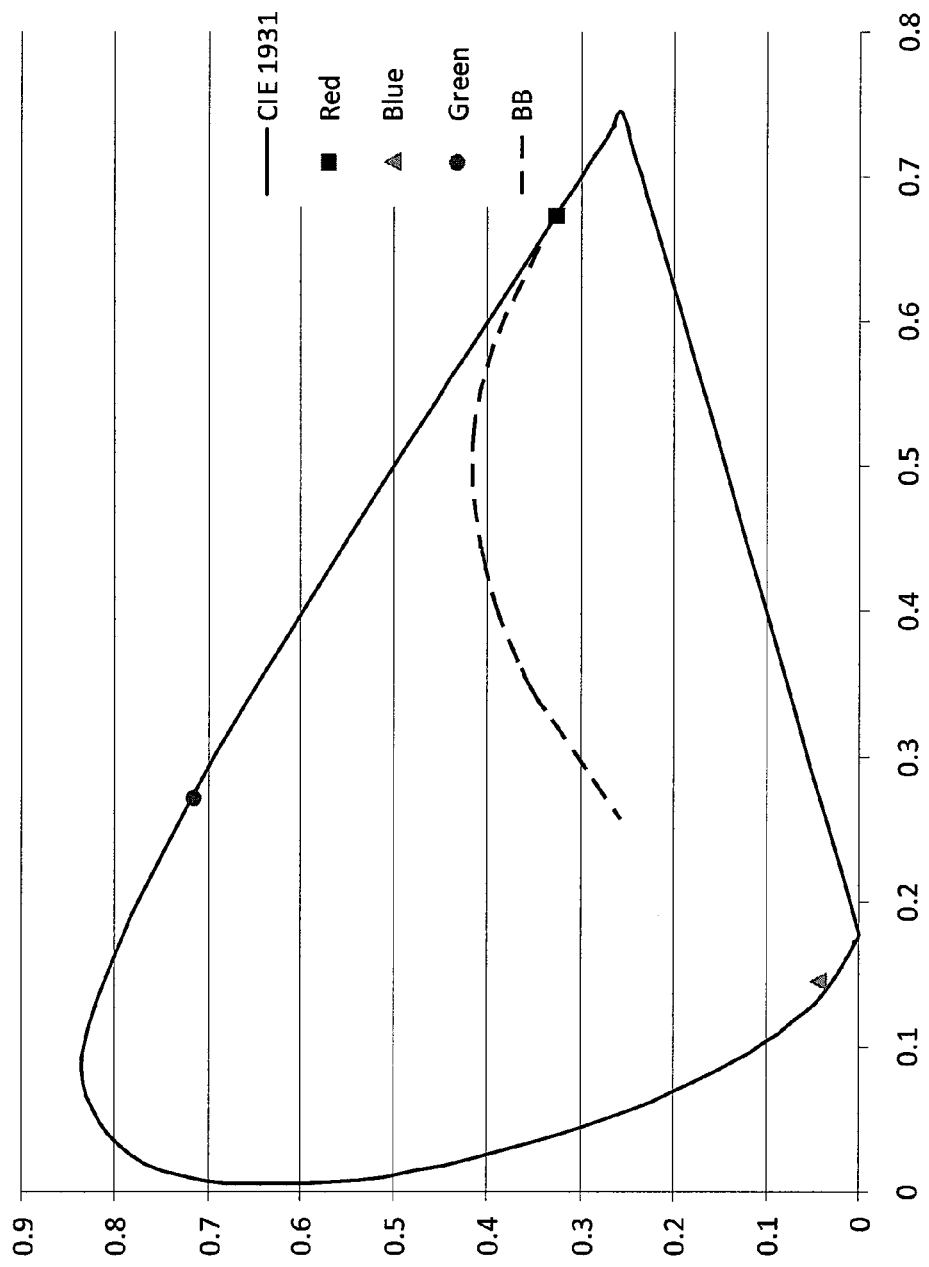
FIG. 7B shows the vertices of the operating gamut within the CIE color chart for the visible light gamut, for the RGB phosphors in the example of FIG. 7A.

FIG. 7B shows the CIE color chart with the black body curve; and on that chart, the drawing shows the color points corresponding to the three color emissions spectra shown in FIG. 7A. Here, the three points represent the vertices of the operating gamut of combined color outputs that may be achieved by variable intensity excitations of the phosphors for purposes of this example. In the example, the blue phosphor emission spectrum roughly centered around 450 nm is represented by the triangular shaped vertex, the green emission centered around 545 nm is represented by the circular shaped vertex, and the red emission spectrum centered around 630 nm is represented by the square vertex. A lighting device using phosphors having emission spectra as shown in FIG. 7A would be able to produce colors corresponding to the three points on the diagram of FIG. 7B as well as points within the triangular operating gamut defined by those three points. Such devices can selectively output combined light of a wide range of different selectable colors encompassing much of the gamut of visible light.

With the sources for pumping the other two phosphors off, the device would output only blue (B) phosphor emission, with the emission spectrum roughly centered around 450 nm, like that shown in FIG. 7A (triangular vertex in FIG. 7B). Similarly, with the sources for pumping the other two phosphors off, the device would output only green (G) phosphor emission centered on a peak at or around 545 nm in FIG. 7A (circular vertex in FIG. 7B), and with the sources for pumping the other two phosphors off, the device would output only red (R) phosphor emission centered around a peak at or around 630 nm in FIG. 7A (square-shaped vertex in FIG. 7B). Other settings with two or three of the phosphors pumped to various excitations levels would result in color light output at various points on the chart within the boundary of the triangle defined by the three color vertices.

As shown in FIG. 7B, the three vertices of the operating gamut are relatively close to the outer boundary of the visible spectrum. In this way, much like the simulation of FIGS. 6A-6C, the actual tri-color phosphors in the example of FIGS. 7A and 7B create a tunable color output that encompasses relatively white light on and around the black body curve as well as a range of colors of more specific hues, many of which exhibit relatively high color saturation out near the boundary of the visible spectrum.

The example of FIGS. 7A and 7B used just one set of phosphors found in a particular display device that was available for test measurements. However, a wide range of phosphors are available. As outlined above, many of the nanophosphors can be tailored to particular applications, by careful growth to a desired nano-crystal size and or by specific doping of the semiconductor materials. Hence, persons of skill in the art will appreciate that phosphors can be selected for a particular lighting device product that can achieve spectra that are even closer to those in the simulations of FIGS. 4A-6C than the phosphors represented by the measured spectra of FIGS. 7A and 7B.

There may be commercial reasons for selecting phosphors that exhibit relatively large Stokes shift, such as doped semiconductor nanophosphors. Large shifts tend to separate the emission spectra of several phosphors used in a particular device 10 from the absorption spectra of the phosphors. As a result, the phosphors tend to exhibit relatively little or no re-absorption. Stated another way, light emitted by a phosphor does not tend to be absorbed by that same phosphor or other phosphors in the device.

If the absorption spectra are in the range of around 460 nm and below, there may be relatively little ambient light that falls within the absorption spectra. As a result, when the sources 11 of the device 10 are off, the phosphors at 18 in the various light guides 12 will emit little or no light. If the bearer materials are color neutral, e.g. clear or translucent, then when the respective source(s) are off the material with phosphor dispersed therein inside each light guide will be similarly color neutral, that is to say, will exhibit littler or no perceptible tint. For example, if the phosphor bearing material is clear, when the respective source 11 is off, the material with the phosphor dispersed therein will appear clear inside the light guide 12.

Figure 8:
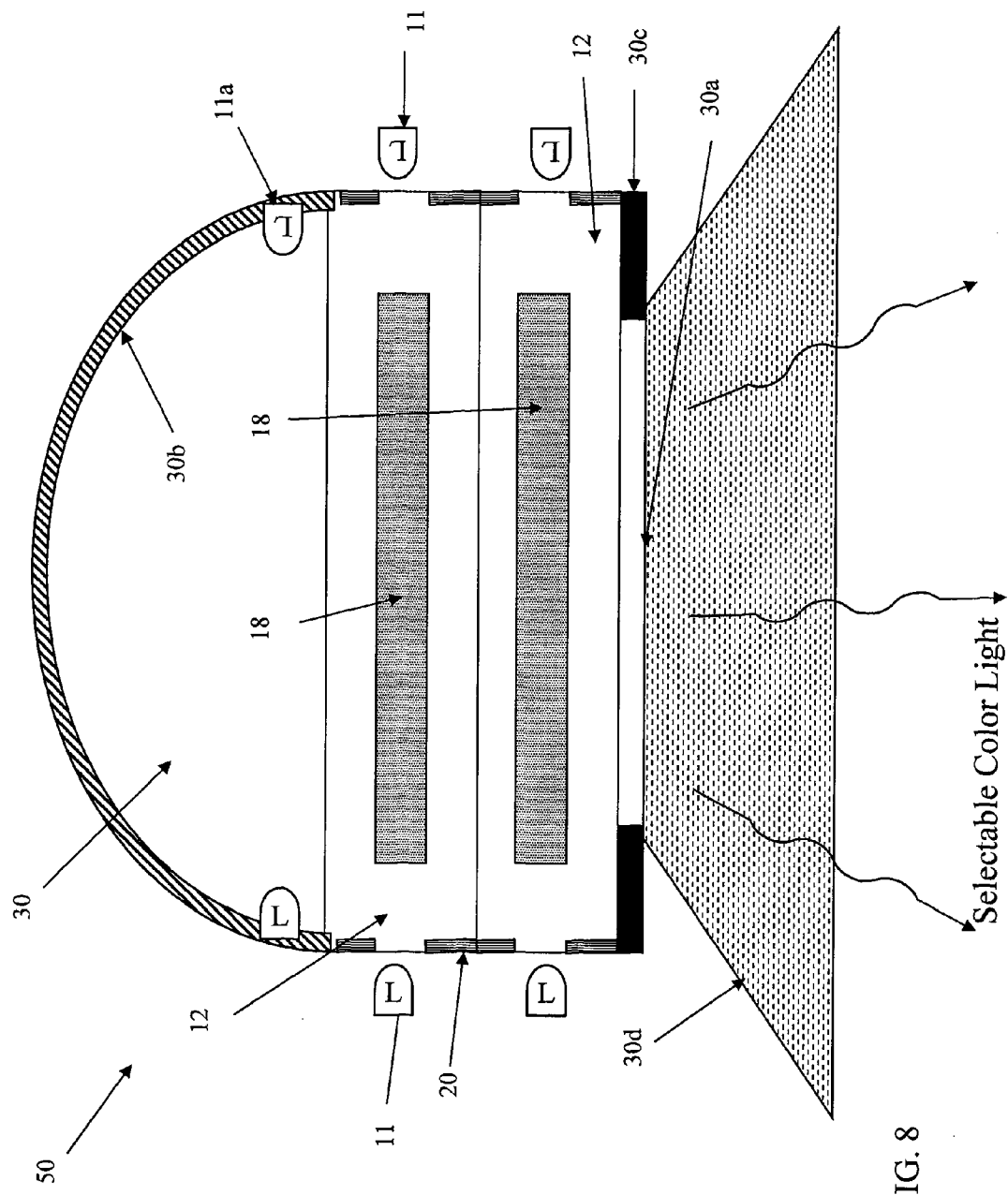
FIG. 8 illustrates another example of a tunable color light emitting device, with certain elements thereof shown in cross-section.
Figure 9:
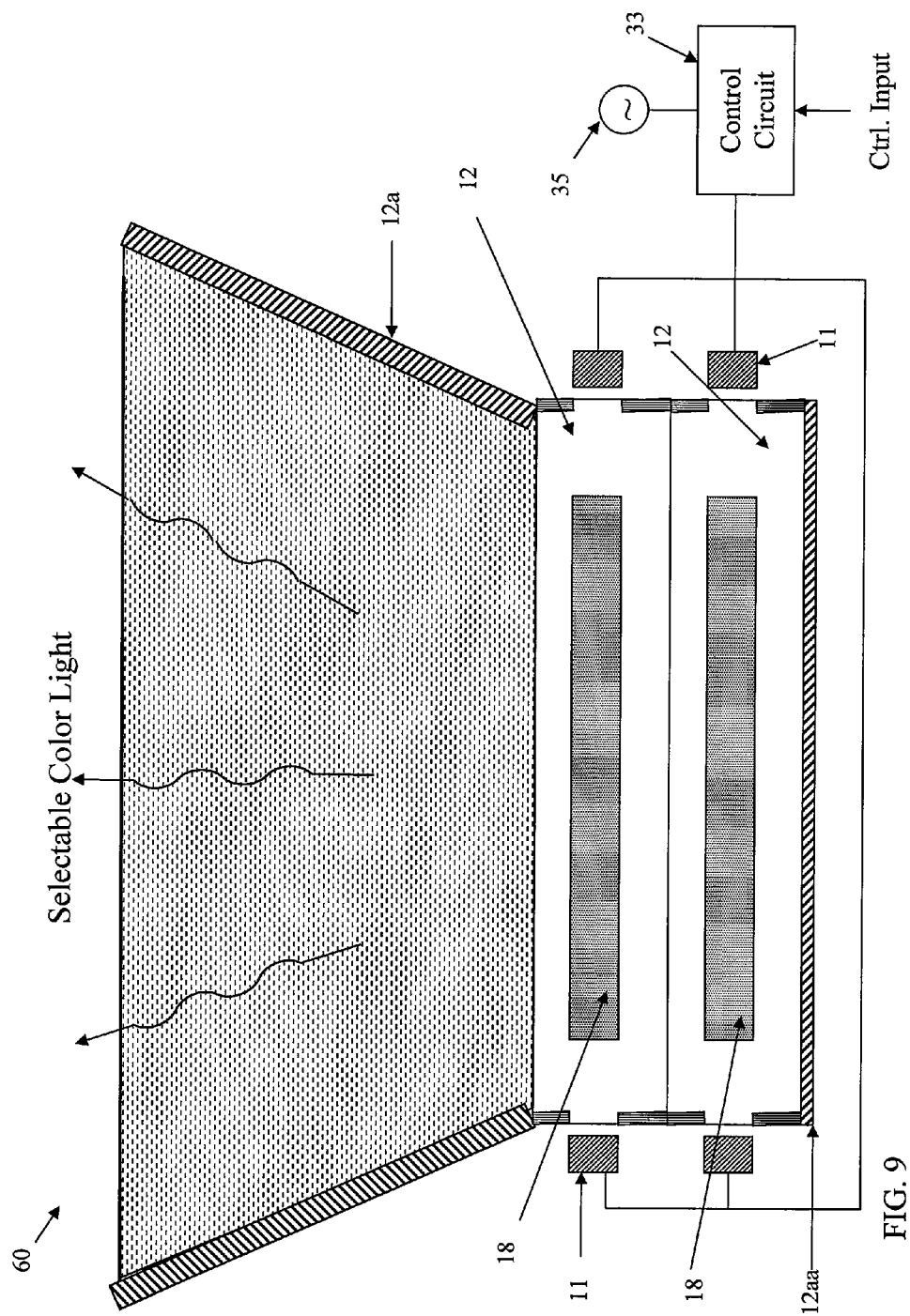
FIG. 9 is yet another example of a tunable color light emitting device, with certain elements thereof shown in cross-section, combined with a control circuit to form an overall light emitting system.

Alternative examples of tunable color light emitting devices and/or systems are shown in FIGS. 8 and 9. If used with phosphors providing relatively pure individual color emissions, these examples could produce a wide range of colors including many colors of relatively high saturation, as well as white, similar to the examples discussed above.

In the example of FIG. 8, device 50 (without the electronics of the system) includes the solid state sources 11, which again for purposes of the example are rated to emit 405 nm near UV energy toward the light guides 12. The device is configured as a downlight type fixture similar to that in overall design of a traditional downlight fixture. The lighting device 50 uses light guides/containers in an optical integrating volume. The light guides could be tubular, as in earlier examples. However, other shapes are possible. For a round type of fixture, the light guides may be disk-shaped.

Energy from the sources impacts on and excites the phosphors 18 contained within the light guides 12. Although two light guides 12 are illustrated in FIG. 8, this example could use just one light guide 12 or could utilize more light guides 12. Some phosphor emissions from the light guides are diffusely reflected by the dome surface 30b back toward an optical aperture 30a. Much of the reflected 405 nm energy in turn impacts on the phosphors 18. When so excited, the phosphor particles re-emit electromagnetic energy but now of the wavelengths for the desired visible spectrum for the intended light output. The visible light produced by the excitation of the phosphor particles diffusely reflects one or more times off of the reflective inner surface 30b of the dome forming cavity 30. This diffuse reflection within the cavity integrates the light produced by the phosphor excitation to form integrated light of the desired color at the optical aperture 30a providing a substantially uniform output distribution of integrated light (e.g. substantially Lambertian). Solid state sources 11a can be provided facing towards cavity 30. Light emitted from solid state sources 11a passes through the light guide(s) 12 once to impact the phosphor contained within the light guide, whereas light from solid state sources 11 passes through the light guides 12 multiple times and impacts the phosphor multiple times.

The optical aperture 30a may serve as the light output of the device 50, directing optically integrated light of the desired color and relatively uniform intensity distribution to a desired area or region to be illuminated in accord with a particular general lighting application of the system. Some masking 30c exists between the edge of the aperture 30a and the outside of the guides 12. The optical cavity is formed by a combination of the reflective dome 30, the reflective ends (or sides if circular) of the guides 12 and the reflective surface of the mask 30c.

The optical cavity can be a solid that is light transmissive (transparent or translucent) of an appropriate material such as acrylic or glass bounded by a diffuse reflector. The optical cavity can also contain a liquid. If a solid is used, the solid forms an integrating volume because it is bounded by reflective surfaces which form a substantial portion of the perimeter of the cavity volume. Stated another way, the assembly forming the optical integrating volume in this example comprises a light transmissive solid and a reflector having a reflective interior surface 30b.

The optical integrating volume is a diffuse optical processing element used to convert a point source input, typically at an arbitrary point not visible from the outside, to a virtual source. At least a portion of the interior surface of the optical integrating volume exhibits a diffuse reflectivity. Hence, in the example, the surface 30b has a diffuse type of reflectivity and is highly reflective (90% or more and possibly 98% or higher). The optical integrating volume may have various shapes. The illustrated cross-section would be substantially the same if the cavity is hemispherical or if the cavity is semi-cylindrical with a lateral cross-section taken perpendicular to the longitudinal axis of the semi-cylinder. For purposes of the discussion, the optical integrating volume in the device 50 is assumed to be hemispherical or nearly hemispherical. Hence, the solid at least above the light guides in the example would be a hemispherical or nearly hemispherical solid, and the reflector would exhibit a slightly larger but concentric hemispherical or nearly hemispherical shape at least along its internal surface, although the hemisphere would be hollow but for the filling thereof by the solid. In practice, the reflector may be formed of a solid material or as a reflective layer on a solid substrate and the solid molded into the reflector. Parts of the light emission surface of the solid (lower flat surface in the illustrated orientation) are masked by the reflective surface 30c. At least some substantial portions of the interior facing reflective surfaces 30c are diffusely reflective and are highly reflective, so that the resulting optical integrating volume has a diffuse reflectivity and is highly reflective.

In this example, the optical integrating volume forms an integrating type optical cavity. The optical integrating volume has a transmissive optical passage or aperture 30a. Emission of light from the phosphors and/or extra LEDs 11a is reflected and diffused within the interior of the optical integrating volume and directed into a region to facilitate a humanly perceptible general lighting application for the device 50.

For some applications, the device 50 includes an additional deflector or other optical processing element as a secondary optic, e.g. to distribute and/or limit the light output to a desired field of illumination. In the example of FIG. 8, the fixture part of the device 50 also utilizes a conical deflector 30d having a reflective inner surface, to efficiently direct most of the light emerging from the virtual light source at optical aperture 30a into a somewhat narrow field of illumination. The deflector 30d has a larger opening at a distal end thereof compared to the end adjacent to the optical aperture 30a. The angle and distal opening size of the conical deflector 30d define an angular field of white light emission from the device 50. Although not shown, the large opening of the deflector may be covered with a transparent plate, a diffuser or a lens, or covered with a grating, to prevent entry of dirt or debris through the cone into the system and/or to further process the output white light. Alternatively, the deflector could be filled with a solid light transmissive material of desirable properties.

The conical deflector 30d may have a variety of different shapes, depending on the particular lighting application. In the example, where the cavity 30 is hemispherical and the optical aperture 30a is circular, the cross-section of the conical deflector is typically circular. However, the deflector may be somewhat oval in shape. Even if the aperture 30a and the proximal opening are circular, the deflector may be contoured to have a rectangular or square distal opening. In applications using a semi-cylindrical cavity, the deflector may be elongated or even rectangular in cross-section. The shape of the optical aperture 30a also may vary, but will typically match the shape of the opening of the deflector 30d. Hence, in the example the optical aperture 30a would be circular. However, for a device with a semi-cylindrical cavity and a deflector with a rectangular cross-section, the optical aperture may be rectangular.

The deflector 30*d* comprises a reflective interior surface between the distal end and the proximal end. In some examples, at least a substantial portion of the reflective interior surface of the conical deflector exhibits specular reflectivity with respect to the integrated light energy. For some applications, it may be desirable to construct the deflector 30*d* so that at least some portions of the inner surface exhibit diffuse reflectivity or exhibit a different degree of specular reflectivity (e.g. quasi-specular), so as to tailor the performance of the deflector 30*d* to the particular application. For other applications, it may also be desirable for the entire interior surface of the deflector to have a diffuse reflective characteristic.

The lighting device 50 outputs selectable color light produced by the solid state sources' 11 excitation of the phosphor materials 18. The phosphors 18 can be doped semiconductor nanophosphors or other phosphors of the types discussed above. The tunable color lighting device 50 could use a variety of different combinations of phosphors to produce a desired range color outputs. Different lighting devices (or systems including such devices) designed for different ranges of color output light and/or different degrees of available tuning may use different combinations of phosphors such as different combinations of two, three, four or more phosphors as discussed earlier. Depending on the selected number and types of phosphors, the output may correspond to one of the operating gamuts (defined by the phosphor color vertices) in FIGS. 4C, 5C, 6C and 7B.

The tunable color lighting device 50 may be coupled to a control circuit, to form a lighting system. Although not shown in FIG. 8 for convenience, such a controller would be coupled to the LED type semiconductor chip in each source 11, for establishing output intensity of electromagnetic energy of the respective LED sources 11. The control circuit may include one or more LED driver circuits for controlling the power applied to one or more sources 11 and thus the intensity of energy output of the source and thus of the system overall. The control circuit may be responsive to a number of different control input signals, for example to one or more user inputs, to turn power ON/OFF and/or to set a desired intensity level for the white light output provided by the device 50. However, the control circuit can also adjust the drives to the sources 11 to tune the color of the light output as in the earlier examples. The color tuning can be responsive to user input or can implement automatic control algorithms, e.g. to change color temperature of the white light output for different times of day or to change color over time for mood or attractive lighting applications.

Turning now to system 60 in FIG. 9, another tunable color light emitting system is described. A fixture portion of the system is shown in cross-section (although some cross-hatching thereof has been omitted for ease of illustration). The circuit elements are shown in functional block form. The system 60 utilizes solid state sources 11, for emitting light energy, for example, of a wavelength in the near UV range, in this case in the 380-420 nm range.

The tunable color light system 60 includes a light guide configuration similar to that in FIG. 8. For example, for a round fixture, the light guides may be disk-shaped. A reflector 12*aa* is positioned below the bottom guide 12 to reflect phosphor emissions aimed downward back up as part of the combined light output shown at the top in the illustrated orientation. The lighting system could be configured for a general lighting application. Examples of general lighting applications include downlighting, task lighting, "wall wash" lighting, emergency egress lighting, as well as illumination of an object or person in a region or area intended to be occupied by one or more people. A task lighting application, for example, typically requires a minimum of approximately 20 footcandles (fcd) on the surface or level at which the task is to be performed, e.g. on a desktop or countertop. In a room, where the light fixture is mounted in or hung from the ceiling or wall and oriented as a downlight, for example, the distance to the task surface or level can be 35 inches or more below the output of the light fixture. At that level, the light intensity will still be 20 fcd or higher for task lighting to be effective. Of course, the system 60 of FIG. 9 may be used in other applications, such as vehicle headlamps, flashlights, etc.

System 60 has a reflector 12*a* with a reflective surface arranged to receive at least some pumped light from the phosphor material 18 from the light guides 12. If the phosphor material is housed, the material forming the walls of the housing exhibit high transmissivity and/or low absorption to light of the relevant wavelengths. The walls of the housing for the phosphor material 18 may be smooth and highly transparent or translucent, and/or one or more surfaces may have an etched or roughened texture.

The disclosed system 60 may use a variety of different structures or arrangements for the reflector 12*a*. For efficiency, the reflective surface of the reflector 12*a* should be highly reflective. The reflective surface may be specular, semi or quasi specular, or diffusely reflective. In the example, the emitting region of light guides 12 fits into or extends through an aperture in a proximal section of the reflector 12*a*. In the orientation illustrated, white light from the phosphor excitation, including any white light emissions reflected by the surface of reflector 12*a* are directed upwards, for example, for lighting a ceiling so as to indirectly illuminate a room or other habitable space below the fixture. The orientation shown, however, is purely illustrative.

The system 60 outputs combined light of selected color produced by the solid state sources 11 exciting the phosphor materials 18 and may be controlled to selectively exhibit one or more of colors in the ranges discussed above. The phosphors 18 can be doped semiconductor nanophosphors or other phosphors of the types discussed above relative to FIGS. 4C, 5C, 6C and 7B. The tunable color light emission system 60 could use a variety of different combinations of phosphors to produce a desired tunable color performance in the output. Different lighting systems designed for different color output light and/or different degrees of available tuning may use different combinations of phosphors such as different combinations of two, three, four or more of the phosphors as discussed earlier. Depending on the selected number and types of phosphors, the output may correspond to one of the operating gamuts (defined by the phosphors color vertices) in FIGS. 4C, 5C, 6C and 7B.

The tunable color light emission system 60 includes a control circuit 33 coupled to the LED type semiconductor chip in the source 11, for establishing output intensity of electromagnetic energy output of each of the LED sources 11. Similar control circuits could be used with the devices 10 and 50 in the earlier examples. The control circuit 33 typically includes a power supply circuit coupled to a voltage/current source, shown as an AC power source 35. Of course, batteries or other types of power sources may be used, and the control circuit 33 will provide the conversion of the source power to the voltage/current appropriate to the particular solid state sources utilized in a particular system. The control circuit 33 includes one or more LED driver circuits for controlling the power applied to one or more sources 11 and thus the intensity of energy output of the source and thus of the system overall. The control circuit 33 may be responsive to a number of different control input signals, for example to one or more user inputs as shown by the arrow in FIG. 9, to turn power ON/OFF and/or to set a desired intensity level for the white light output provided by the system 60. However, the control circuit can also adjust the drives to the sources 11 to tune the color of the light output as in the earlier examples. The color tuning can be responsive to user input or can implement automatic control algorithms, e.g. to change the color temperature of the white light output for different times of day.

Figures 10, 11:
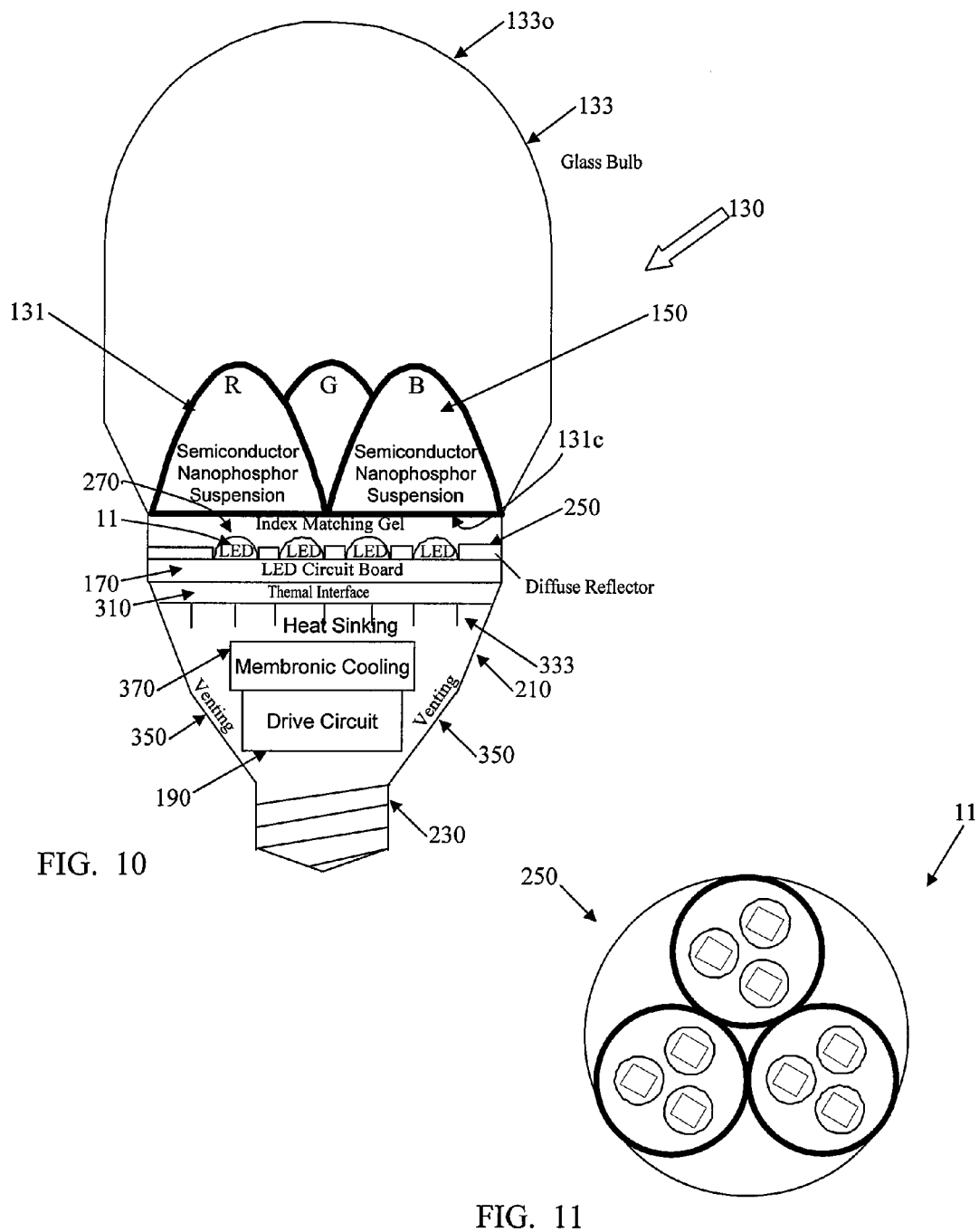
FIG. 10 a cross-sectional view of a tunable color light emitting system, in the form of a lamp for lighting applications, which uses a solid state source and semiconductor nanophosphors pumped by energy from the source to produce tunable color light.
FIG. 11 is a plan view of the LEDs and reflector of the lamp of FIG. 10.

FIG. 10 illustrates yet another tunable color light emission system in cross section. Here the system is in the form of a lamp product, in a form factor somewhat similar to a form factor of an incandescent lamp. The exemplary system 130 may be utilized in a variety of lighting applications. The solid state sources 11 are similar to those previously discussed. In the example, the sources comprise a plurality of light emitting diode (LED) devices, although other semiconductor devices might be used. Hence, in the example of FIG. 10, each of the three separately controllable sources 11 takes the form of a number of LEDs (e.g. three LEDs for each source as shown in the view of FIG. 11).

It is contemplated that the LEDs 11 could be of any type rated to emit energy of wavelengths from the blue/green region around 460 nm down into the UV range below 380 nm. Exemplary nanophosphors have absorption spectra having upper limits around 430 nm, although other phosphors may be used that have somewhat higher limits on the wavelength absorption spectra and therefore may be used with LEDs or other solid state devices rated for emitting wavelengths as high as say 460 nm. In the present example, the LEDs 11 are near UV LEDs rated for emission somewhere in the 380-420 nm range, such as the 405 nm LEDs discussed earlier, although UV LEDs could be used with the nanophosphors.

As in the earlier examples, the phosphor-centric tunable lighting system 130 could utilize two, three or more phosphors that produce a relatively pure or mono-chromatic light of respectively different colors, so that the lamp 130 can be controlled to provide a wide range of different colors, encompassing much of the gamut of visible light.

Here, for discussion purposes two, three or more types of semiconductor nanophosphors are used in the system 130 to convert energy from the respective sources into visible light of appropriate spectra to produce a desired range of colors in the visible light output of the lamp. The semiconductor nanophosphors again are remotely deployed, in that they are outside of the individual device packages or housings of the LEDs 11. For this purpose, the exemplary system includes a number of optical elements in the form of phosphor containers formed of optically transmissive material coupled to receive near UV electromagnetic energy from the LEDs 11 forming the solid state sources. Each container contains a material, which at least substantially fills the interior volume of the container. For example, if a liquid is used, there may be some gas in the container as well, although the gas should not include oxygen as oxygen tends to degrade the nanophosphors. The material may be a solid or a gas. In this example, the system includes at least one semiconductor nanophosphor dispersed in the material in each container.

As noted, the material may be a solid, although liquid or gaseous materials may help to improve the florescent emissions by the nanophosphors in the material. For example, alcohol, oils (synthetic, vegetable, silicon or other oils) or other liquid media may be used. A silicone material, however, may be cured to form a hardened material, at least along the exterior (to possibly serve as an integral container), or to form a solid throughout the intended volume. If hardened silicon is used, however, a glass container still may be used to provide an oxygen barrier to reduce nanophosphor degradation due to exposure to oxygen.

If a gas is used, the gaseous material, for example, may be hydrogen gas, any of the inert gases, and possibly some hydrocarbon based gases. Combinations of one or more such types of gases might be used.

Similar materials may be used, for example contained in the light guides, to remotely deploy the phosphors in the earlier examples.

In the illustrated example, three containers 131 are provided, each containing a phosphor bearing material 150. The three containers are enclosed by an outer bulb 133 which provides a desired output distribution and form factor, e.g. like a glass bulb of an A-lamp incandescent. The glass bulb 133 encloses three optical elements having the different nanophosphors, for RGB emissions as in several of the earlier examples. The sources 11 and elements 131 provide sufficient optical separation to support the desired color tuning, as mentioned earlier. The elements 131 could be light guides as in the earlier examples but with pumping light entry from only one end and a transmissive or reflective opposite end. In the example, however, each of the three optical elements is a container 131. The container wall(s) are transmissive with respect to at least a substantial portion of the visible light spectrum. For example, the glass of each container 131 will be thick enough to provide ample strength to contain a liquid or gas material if used to bear the semiconductor nanophosphors in suspension, as shown at 150. However, the material of the container 131 will allow transmissive entry of energy from the LEDs 11 to reach the nanophosphors in the material 150 and will allow transmissive output of visible light principally from the excited nanophosphors.

Each glass element/container 131 receives energy from the LEDs 11 through a surface of the container, referred to here as an optical input coupling surface 131c. The example shows the surface 131c as a flat surface, although obviously other contours may be used. Light output from the system 130 emerges through one or more other surfaces of the containers 131 and through and outer surface of bulb 133, referred to here as output surface 133o. In the example, the bulb 133 here is glass, although other appropriate transmissive materials may be used. For a diffuse outward appearance of the bulb, the output surface(s) 133o may be frosted white or translucent. Alternatively, the output surface 133o may be transparent. The emission surfaces of the containers 131 may be may be frosted white or translucent, although the optical input coupling surfaces 131c might still be transparent to reduce reflection of energy from the LEDs 11 back towards the LEDs.

Although a solid could be used, in this example, each container 131 is at least substantially filled with a liquid or gaseous material 150 bearing a different semiconductor nanophosphor dispersed in the liquid or gaseous material 150. The example shows three containers 131 containing material 150 bearing nanophosphors for red (R), green (G) and blue (B) emissions, as in several of the earlier light guide examples. The RGB emissions may correspond to RGB spectra discussed above relative to FIGS. 4-7. Also, for further discussion, we will assume that the LEDs 11 are near UV emitting LEDs, such as 405 nm LEDs or other types of LEDs rated to emit somewhere in the wavelength range of 380-420 nm, as in several earlier examples. Each of the semiconductor nanophosphors (Red, Green, and Blue) is of a type excited in response to near UV electromagnetic energy from the LEDs 11 of the solid state source. When so excited, each semiconductor nanophosphor re-emits visible light of a different spectrum. However, each such emission spectrum has substantially no overlap with excitation spectra of the semiconductor nanophosphors. When excited by the electromagnetic energy received from the LEDs 11, the semiconductor nanophosphors in material 150 in the three containers 131 together produce visible light output for the system 130 through the exterior surface(s) of the glass bulb 133.

The liquid or gaseous material 150 with the semiconductor nanophosphor dispersed therein appears at least substantially clear when the system 130 is off. For example, alcohol, oils (synthetic, vegetable or other oils) or other clear liquid media may be used, or the liquid material may be a relatively clear hydrocarbon based compound or the like. Exemplary gases include hydrogen gas, clear inert gases and clear hydrocarbon based gases. The doped semiconductor nanophosphors in the specific examples described below absorb energy in the near UV and UV ranges. The upper limits of the absorption spectra of exemplary phosphors, e.g. doped semiconductor nanophosphors, are all at or around 430 nm, however, the exemplary nanophosphors are relatively insensitive to other ranges of visible light often found in natural or other ambient white visible light. Hence, when the system 130 is off, the semiconductor nanophosphors exhibit little or no light emissions that might otherwise be perceived as color by a human observer. Even though not emitting, the particles of the semiconductor nanophosphors may have some color, but due to their small size and dispersion in the material, the overall effect is that the material 150 appears at least substantially clear to the human observer, that is to say it has little or no perceptible tint.

The LEDs 11 are mounted on a circuit board 170. The exemplary system 130 also includes circuitry 190. Although drive from DC sources is contemplated for use in existing DC lighting systems, the examples discussed in detail utilize circuitry configured for driving the LEDs 11 in response to alternating current electricity, such as from the typical AC main lines. The circuitry may be on the same board 170 as the LEDs or disposed separately within the system and electrically connected to the LEDs 11. Electrical connections of the circuitry 190 to the LEDs and the lamp base are omitted here for simplicity. Details of an example of drive circuitry are discussed later with regard to FIG. 12. However, as in the earlier examples, independent control of the drive to the three sets of LEDs that separately pump the three different nanophosphors in the containers 131 allows control of the mix of phosphor produced R, G and B light, to effectively tune the color of the light output.

A housing 210 at least encloses the circuitry 190. In the example, the housing 210 together with a base 230 and a face of the glass bulb 133 also enclose the LEDs 11. The system 130 has a lighting industry standard base 230 mechanically connected to the housing and electrically connected to provide alternating current electricity to the circuitry 190 for driving the LEDs 11.

The base 230 may be any common standard type of lamp base, to permit use of the system 130 in a particular type of electrical socket. Common examples include an Edison base, a mogul base, a candelabra base and a bi-pin base. The base 230 may have electrical connections for a single intensity setting or additional contacts in support of three-way intensity setting/dimming.

The exemplary system 130 of FIG. 10 may include one or more features intended to prompt optical efficiency. Hence, as illustrated, the system 130 includes a diffuse reflector 250. The circuit board 170 has a surface on which the LEDs 11 are mounted, so as to face toward the light receiving surface of the glass bulb 133 containing the nanophosphor bearing material 150. The reflector 250 covers parts of that surface of the circuit board 170 in one or more regions between the LEDs 11. FIG. 11 is a view of the LEDs 11 and the reflector 250. When excited, the nanophosphors in the material 150 emit light in many different directions, and at least some of that light would be directed back toward the LEDs 11 and the circuit board 170. The diffuse reflector 250 helps to redirect much of that light back through the glass bulb 133 for inclusion in the output light distribution. The system may use any number of LEDs 11 sufficient to provide a desired output intensity.

There may be some air gap between the emitter outputs of the LEDs 11 and the facing optical coupling surface 131c of the containers 131 (FIG. 10). However, to improve out-coupling of the energy from the LEDs 11 into the light transmissive glass of the containers 131, it may be helpful to provide an optical grease, glue or gel 270 between the surfaces 131c of the glass containers 131 and the optical outputs of the LEDs 11. This index matching material 270 eliminates any air gap and provides refractive index matching relative to the material of the glass of each container 131.

The examples also encompass technologies to provide good heat conductivity so as to facilitate dissipation of heat generated during operation of the LEDs 11. Hence, the system 130 includes one or more elements forming a heat dissipater within the housing for receiving and dissipating heat produced by the LEDs 11. Active dissipation, passive dissipation or a combination thereof may be used. The system 130 of FIG. 10, for example, includes a thermal interface layer 310 abutting a surface of the circuit board 170, which conducts heat from the LEDs and the board to a heat sink arrangement 333 shown by way of example as a number of fins within the housing 210. The housing 210 also has one or more openings or air vents 350, for allowing passage of air through the housing 210, to dissipate heat from the fins of the heat sink 333.

The thermal interface layer 310, the heat sink 333 and the vents 350 are passive elements in that they do not consume additional power as part of their respective heat dissipation functions. However, the system 130 may include an active heat dissipation element that draws power to cool or otherwise dissipate heat generated by operations of the LEDs 11. Examples of active cooling elements include fans, Peltier devices or the like. The system 130 of FIG. 10 utilizes one or more membronic cooling elements. A membronic cooling element comprises a membrane that vibrates in response to electrical power to produce an airflow. An example of a membronic cooling element is a SynJet® sold by Nuventix. In the example of FIG. 10, the membronic cooling element 370 operates like a fan or air jet for circulating air across the heat sink 333 and through the air vents 350.

In the orientation illustrated in FIG. 10, white light from the semiconductor nanophosphor excitation is dispersed upwards and laterally, for example, for omni-directional lighting of a room from a table or floor lamp. The orientation shown, however, is purely illustrative. The system 130 may be oriented in any other direction appropriate for the desired lighting application, including downward, any sideways direction, various intermediate angles, etc. In the example of FIG. 10, the glass bulb 133 produces a wide dispersion of output light, which is relatively omni-directional (except directly downward in the illustrated orientation). Of course, other bulb shapes may be used. Some bulbs may have some internal reflective surfaces, e.g. to facilitate a particular desired output distribution of the tunable white light.

The system 130 of FIG. 10 has one of several industry standard lamp bases 230, shown in the illustration as a type of screw-in base. The glass bulb 133 exhibits a form factor within standard size, and the output distribution of light emitted via the bulb 133 conforms to industry accepted specifications. Those skilled in the art will appreciate that these aspects of the system facilitate use of it as a replacement for existing systems, such as incandescent lamps and compact florescent lamps.

The housing 210, the base 230 and components contained in the housing 210 can be combined with a bulb and containers in a variety of different shapes. As such, these elements together may be described as a 'light engine' portion of the system. Theoretically, the engine alone or in combination with a standard sized set of the containers could be modular in design with respect to a variety of different bulb configuration, to allow a user to interchange glass bulbs, but in practice the lamp is an integral product. The light engine may be standardized across several different lamp product lines.

As outlined above, the system 130 will include or have associated therewith phosphors remotely deployed in multiple containers external to the LEDs 11 of the solid state source(s). As such, the phosphors are located apart from the semiconductor chip of the LEDs 11 used in the particular lamp 10, that is to say remotely deployed.

The phosphors are dispersed, e.g. in suspension, in a liquid or gaseous material 150, within a container (bulb 133 in the system of FIG. 10). The liquid or gaseous medium preferably exhibits high transmissivity and/or low absorption to light of the relevant wavelengths, although it may be transparent or somewhat translucent. Although alcohol, oils (synthetic, vegetable, silicon or other oils) or other media may be used, the medium may be a hydrocarbon material, in either a liquid or gaseous state.

In FIG. 10, the system is able to adjust or 'tune' the color of the output light, by adjusting the levels of emissions of the RGB phosphors. The LEDs are used to pump the three separately contained semiconductor nanophosphors (R, G, and B). The system allows for the changing of intensity of emission of visible light by the three (R, G, B) phosphors separately contained phosphors. Changing the intensity of energy that the respective sources supply to the different housed phosphors changes the respective pumping energy supplied to the phosphors, which in turn changes the levels of excitation and thus changes the respective intensities of the RGB emissions of the excited phosphors. The color or spectrum of energy of the emissions from the solid state source 11 is essentially the same (same rating although there may be variations with manufacturers' tolerances), but the phosphors are different (i.e. R, G, and B), separately contained and excited to independently controllable levels as in the earlier examples. The color of the combined output light varies with changes in the different relative levels of the light emissions from the three different phosphors. For example, if the RGB phosphors exhibit the emission spectra of FIG. 7A, the operating gamut of the output of the lamp 130 would be defined by the color vertices in the chart of FIG. 7B.

The drive circuit may be programmed to vary color over time. Alternatively, the drive circuit may receive control signals modulated on the power received through the standard lamp base.

The sources 11 in the various examples discussed so far may be driven by any known or available circuitry that is sufficient to provide adequate power to drive the sources at the level or levels appropriate to the particular lighting application of each particular fixture and to adjust those levels to provide desired color tuning. Analog and digital circuits for controlling operations and driving the sources are contemplated. Those skilled in the art should be familiar with various suitable circuits. However, for completeness, we will discuss an example in some detail below.

Figure 12:
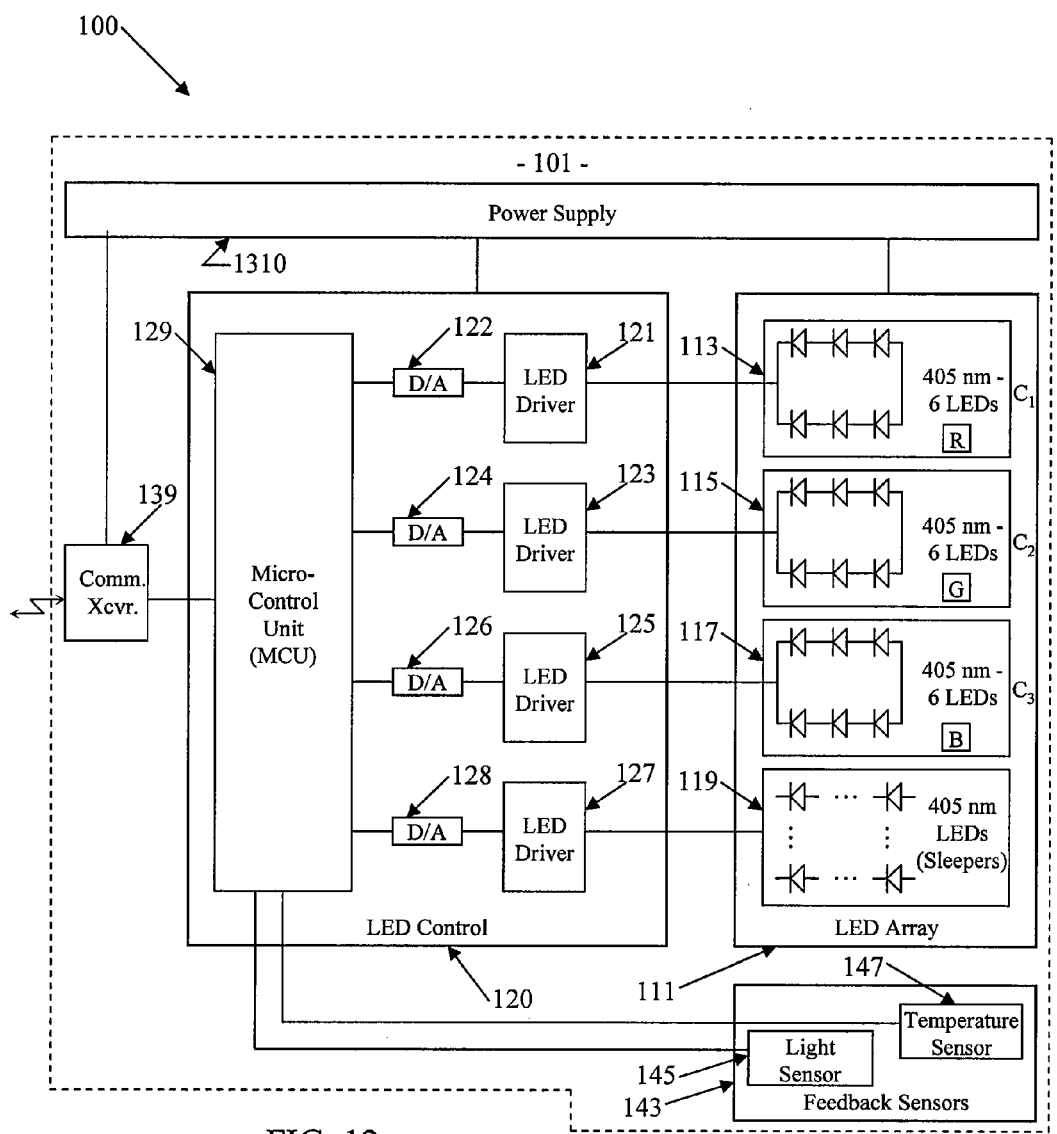
FIG. 12 is a functional block type circuit diagram, of an implementation of the system control circuit and LED array for a tunable color light emitting system.

An example of suitable circuitry, offering relatively sophisticated control capabilities, with reference to FIG. 12. A simpler circuit or a subset of such a circuit would more likely be included inside the lamp system of FIG. 10. For devices like those of FIGS. 1, 8 and 9, however, circuitry like that of FIG. 12 could be deployed in a separate housing analogous to the ballast of a florescent light.

The drawing of FIG. 12 is a block diagram of an exemplary tunable color light emission system 100, including the control circuitry and LED type sold state light sources. The LEDs and possibly some of the other electronic elements of the system could be combined with any of the device examples discussed above to form systems, with the LEDs in array 111 shown in FIG. 12 serving as the various solid state sources 11. The circuitry of FIG. 12 provides digital programmable control of the tunable color light.

In the light engine 101 of FIG. 12, the set of solid state sources, such as those of UV or near UV light takes the form of a LED array 111. In this example, the array 111 comprises 405 nm LEDs arranged in each of four different strings forming lighting channels C1 to C4 for pumping of RGB phosphors. The array 111 includes three initially active strings of LEDs, represented by LED blocks 113 (for pumping red phosphors), 115 (for pumping green phosphors) and 117 (for pumping blue phosphors).

The strings in this example have the same number of LEDs. LED blocks 113, 115 and 117 each comprises 6 LEDs. The LEDs may be connected in series, but in the example, two sets of 3 series connected LEDs are connected in parallel to form the blocks or strings of 6 405 nm near UV LEDs 113, 115, 117. The LEDs 113 may be considered as a first channel C1 to pump a red emitting phosphor in a first of the containers or light guides, the LEDs 115 may be considered as a second channel C2 for pumping a green emitting phosphor in a second of the containers or light guides, whereas the LEDs 117 may be considered as a third channel C3 to pump a blue emitting phosphor in a third of the containers or light guides.

One set of 3 LEDs might be located at each end of a tubular light guide like in FIGS. 1A and 1C, or the complete set of 6 LEDs might be located around the periphery of a disk-shaped light guide like in FIG. 8 or FIG. 9. In FIG. 10 the different sets of 6 LEDs would supply pumping energy to respective containers.

The LED array 111 in this example also includes a number of additional or 'other' LEDs 119. Some implementations may include various color LEDs, such as specific primary color LEDs, IR LEDs or UV LEDs, for various ancillary purposes. Another approach might use the LEDs 119 for a fourth channel of 405 nm LEDs to further control intensity of pumping another phosphor in a fourth of the containers or light guides (see simulations in FIGS. 4-6). In the example, however, the additional LEDs 119 are 'sleepers.' Although shown for simplicity as a single group 119, there would likely be independently controllable sleepers 119 associated with each of the optical elements (light guides or containers) of a particular tunable color lighting device. Initially, the LEDs 113-117 would be generally active and operate in the normal range of intensity settings, whereas sleepers 119 initially would be inactive. Inactive LEDs are activated when needed, typically in response to feedback indicating a need for increased output to pump one or more of the phosphors (e.g. due to decreased performance of one, some or all of the originally active LEDs 113-117). The set of sleepers 119 may include any particular number and/or arrangement of the LEDs as deemed appropriate for a particular application.

Strings 113, 115, and 117 may be considered a solid state light emitting element or 'source' coupled to supply near UV light so as to pump or excite the red, green, blue, phosphors, respectively, in optical elements of a lighting device. Each string comprises a plurality of light emitting diodes (LEDs) serving as individual solid state emitters. In the example of FIG. 12, each such element or string 113 to 117 comprises six of the 405 nm LEDs.

The electrical components shown in FIG. 12 also include a LED control system 120. The control system 121 includes LED driver circuits for the various LEDs of the array 111 as well as a micro-control unit (MCU) 129. In the example, the MCU 129 controls the LED driver circuits via digital-to-analog (D/A) converters. The driver circuit 121 drives the LEDs 113 of the first channel C1, the driver circuit 123 drives the LEDs 115 of the second channel C2, and the driver circuit 125 drives the LEDs 117 of the third channel C3. In a similar fashion, when active, the driver circuit 127 provides electrical current to the other LEDs 119.

Although current modulation (e.g. pulse width modulation) or current amplitude control could be used, this example uses constant current to the LEDs. Hence, the intensity of the emitted light of a given near UV LED in the array 111 is proportional to the level of current supplied by the respective driver circuit. The current output of each driver circuit is controlled by the higher level logic of the system, in this case, by the programmable MCU 129 via the respective A/D converter.

The driver circuits supply electrical current at the respective levels for the individual sets of 405 nm LEDs 113-119 to cause the LEDs to emit light. The MCU 129 controls the LED driver circuit 121 via a D/A converter 122, and the MCU 129 controls the LED driver circuit 123 via a D/A converter 124. Similarly, the MCU 129 controls the LED driver circuit 125 via a D/A converter 126. The amount of the emitted light of a given LED set is related to the level of current supplied by the respective driver circuit.

In a similar fashion, the MCU 129 controls the LED driver circuit 127 via the D/A converter 128. When active, the driver circuit 127 provides electrical current to the appropriate ones of the sleeper LEDs 119, for example, one or more sleeper LEDs associated with a particular optical element/phosphor of the lighting device.

In operation, one of the D/A converters receives a command for a particular level, from the MCU 129. In response, the converter generates a corresponding analog control signal, which causes the associated LED driver circuit to generate a corresponding power level to drive the particular string of LEDs. The LEDs of the string in turn output light of a corresponding intensity to pump the phosphor in the associated optical element. The D/A converter will continue to output the particular analog level, to set the LED intensity in accord with the last command from the MCU 129, until the MCU 129 issues a new command to the particular D/A converter.

The control circuit could modulate outputs of the LEDs by modulating the respective drive signals. In the example, the intensity of the emitted light of a given LED is proportional to the level of current supplied by the respective driver circuit. The current output of each driver circuit is controlled by the higher level logic of the system. In this digital control example, that logic is implemented by the programmable MCU 129, although those skilled in the art will recognize that the logic could take other forms, such as discrete logic components, an application specific integrated circuit (ASIC), etc.

The LED driver circuits and the microcontroller 129 receive power from a power supply 1310, which is connected to an appropriate power source (not separately shown). For most general lighting applications, the power source will be an AC line current source, however, some applications may utilize DC power from a battery or the like. The power supply 1310 provides AC to DC conversion if necessary, and converts the voltage and current from the source to the levels needed by the LED driver circuits and the MCU 129.

A programmable microcontroller or microprocessor, such as the MCU 129, typically includes or has coupled thereto random-access memory (RAM) for storing data and read-only memory (ROM) and/or electrically erasable read only memory (EEROM) for storing control programming and any pre-defined operational parameters, such as pre-established light data for the current setting(s) for the strings of LEDs 113 to 119. The microcontroller 129 itself comprises registers and other components for implementing a central processing unit (CPU) and possibly an associated arithmetic logic unit. The CPU implements the program to process data in the desired manner and thereby generates desired control outputs. The microcontroller 129 is programmed to control the LED driver circuits 121 to 127 via the A/D converters 122 to 128 to set the individual output intensities of the 405 nm LEDs to desired levels, and in this circuit example to implement the spectral adjustment/control of the output light.

For example, the programming may define intensity levels or "recipes" for the strings of LEDs 113 to 119 to achieve preset combined color outputs produced by the pumped phosphors. The programming may also cause the MCU to vary respective intensity levels for the strings of LEDs 113 to 119 to achieve particular variable color outputs over time, in a predefined sequence or cycle, for example, for a colored light show effect.

The electrical system associated with the fixture also includes a digital data communication interface 139 that enables communications to and/or from a separate or remote transceiver (not shown in this drawing) which provides communications for an appropriate control element, e.g. for implementing a desired user interface. A number of fixtures of the type shown may connect over a common communication link, so that one control transceiver can provide instructions via interfaces 139 to the MCUs 129 in a number of such fixtures. The transceiver at the other end of the link (opposite the interface 139) provides communications to the fixture(s) in accord with the appropriate protocol. Different forms of communication may be used to offer different links to the user interface device. Some versions, for example, may implement an RF link to a personal digital assistant by which the user could select intensity or brightness settings. Various rotary switches and wired controls may be used, and other designs may implement various wired or wireless network communications. Any desired medium and/or communications protocol may be utilized, and the data communication interface 139 may receive digital intensity setting inputs and/or other control related information from any type of user interface or master control unit.

To insure that the desired performance is maintained, the MCU 129 in this implementation receives a feedback signal from one or more sensors 143. A variety of different sensors may be used, alone or in combination, for different applications. In the example, the sensors 143 include a light intensity sensor 145 and a temperature sensor 147. A color sensor may be provided, or the sensor 145 may be of a type that senses overall light intensity as well as intensity of light in various bands related to different colors so that the MCU can determine color or spectral information from the measured intensities. The MCU 129 may use the sensed temperature feedback in a variety of ways, e.g. to adjust operating parameters if an excessive temperature is detected.

The light sensor 145 provides intensity information to the MCU 129. A variety of different sensors are available, for use as the sensor 145. In a cavity optic such as in the device 50 of FIG. 8, the light sensor 145 might be coupled to detect intensity of the integrated light either emitted through the aperture or as integrated within the cavity. For example, the sensor 145 may be mounted alongside the LEDs for directly receiving light processed within the optic. The MCU 129 uses the color and/or intensity feedback information to determine when to activate particular sleeper LEDs 119, e.g. to compensate for decreased performance of a respective set of LEDs for one of the initially active control channels C1 to C3. The intensity feedback information may also cause the MCU 129 to adjust the constant current levels applied to one or more of the strings 113 to 117 of 405 nm LEDs in the control channels C1 to C3, to provide some degree of compensation for declining performance before it becomes necessary to activate the sleepers.

Control of the near UV LED outputs could be controlled by selective modulation of the drive signals applied to the various LEDs. For example, the programming of the MCU 129 could cause the MCU to activate the A/D converters and thus the LED drivers to implement pulse width or pulse amplitude modulation to establish desired output levels for the LEDs of the respective control channels C1 to C3. Alternatively, the programming of the MCU 129 could cause the MCU to activate the A/D converters and thus the LED drivers to adjust otherwise constant current levels of the LEDs of the respective control channels C1 to C3. However, in the example, the MCU 129 simply controls the light output levels by activating the A/D converters to establish and maintain desired magnitudes for the current supplied by the respective driver circuit and thus the proportional intensity of the emitted light from each given string of LEDs. Proportional intensity of each respective string of LEDs provides proportional pumping or excitation of the phosphors in optical elements coupled to the respective strings and thus proportional amounts of phosphor light emissions in the output of the system.

For an ON-state of a string/channel, the program of the MCU 129 will cause the MCU to set the level of the current to the desired level for a particular spectral or intensity setting for the system light output, by providing an appropriate data input to the D/A converter for the particular channel. The LED light output is proportional to the current from the respective driver, as set through the D/A converter. The D/A converter will continue to output the particular analog level, to set the current and thus the LED output intensity in accord with the last command from the MCU 129, until the MCU 129 issues a new command to the particular D/A converter. While ON, the current will remain relatively constant. The LEDs of the string thus output near UV light of a corresponding relatively constant intensity. Since there is no modulation, it is expected that there will be little or no change for relatively long periods of ON-time. However, the MCU can vary the relative intensities over time in accord with a program, to change the color tuning of the light output, e.g. in response to user input, over a timing cycle, based on time of day, or in response to a sensor that detects ambient light levels.

The discussion above has concentrated mainly on variable color lighting devices or systems that may provide a wide range of possible types of light output by using phosphors each having a substantially pure color emission spectrum, for example. As the phosphor emission spectra become more pure, the spectra from the phosphor emissions effectively move out closer to the edges of the CIE color chart, as illustrated in the CIE charts for the simulations and the CIE chart for the specific RGB example. The combined light output of a device or system using such phosphors can generate visible output light within an operating gamut having vertices at the respective points corresponding to the phosphor emissions. Within that gamut, there may be some range of relatively white light and pastel colors, however, there will also be many different highly saturated colors. Those skilled in the art will recognize that the phosphor-centric light color control in devices and systems that deploy phosphors remotely from the chips within the solid state sources, for general lighting applications and similar applications, may be used and implemented in a variety of different or additional ways.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A solid state lighting system for variable color lighting, comprising:
a plurality of independently controllable sources, each of the sources comprising one or more solid state devices for emitting electromagnetic energy in a predetermined spectrum, each solid state source comprising a semiconductor chip and an enclosure about the semiconductor chip;
a plurality of optical elements positioned outside the enclosures of the solid state sources, each of the optical elements arranged to receive electromagnetic energy from at least a respective one of the solid state sources coupled thereto;
a plurality of different remotely deployed phosphors, a different one of the phosphors being disposed in each of the optical elements for excitation by electromagnetic energy from a respective one of the sources but remote from semiconductors of the solid state devices, each of the phosphors having an absorption spectrum that includes the predetermined spectrum of the electromagnetic energy from the sources, each of the phosphors emitting a different respective color of visible light that is at least substantially pure, wherein:
the optical elements are arranged so that each phosphor in a respective one of the optical elements receives little or no excitation due to electromagnetic energy from any of the sources coupled to a different one of the optical elements, and
when the sources are on, a visible light output of the lighting system includes a combination of color lights from the different phosphors, from the plurality of optical elements;
a controller coupled to independently control the solid state sources to enable adjustment of respective intensities of the electromagnetic energy of the predetermined spectrum emitted by the solid state sources to adjust relative levels of excitations of the different phosphors to control color of the visible light output of the lighting system.

2. The solid state lighting system of claim 1, wherein each of the optical elements is configured to act as a light guide with respect to electromagnetic energy received from the respective source coupled thereto and to allow diffuse emissions of light emitted by the respective phosphor disposed therein when excited.

3. The solid state lighting system of claim 1, wherein each of the phosphors is a semiconductor nanophosphor.

4. The solid state lighting system of claim 3, wherein each of the semiconductor nanophosphors is a doped semiconductor nanophosphor.

5. The solid state lighting system of claim 1, wherein:
each of the solid state devices comprises one or more light emitting diodes,
each light emitting diode is rated for producing electromagnetic energy of a wavelength in the range of 460 nm and below, and
the absorption spectrum of each phosphor has an upper limit at approximately 460 nm or below.

6. The solid state lighting system of claim 1, further comprising:
an optical mixing element optically coupled to the optical elements to receive and mix light emitted by the phosphors when excited, from the optical elements, to form the visible light output of the system.

7. The solid state lighting system of claim 6, wherein the optical mixing element forms an optical integrating cavity.

8. The solid state lighting system of claim 1, wherein:
a first optical element is configured to act as a light guide with respect to electromagnetic energy received from a first solid state source and to allow diffuse emissions of light emitted by a first phosphor when excited; and
a second optical element is configured to act as a light guide with respect to electromagnetic energy received from a second source and to allow diffuse emissions of light emitted by a second phosphor when excited.

9. The solid state lighting system of claim 1, wherein the purity of each of the color lights emitted by the phosphors is at least 0.8.

10. The solid state lighting system of claim 1, wherein:
a first optical element comprises a container having a material bearing a first phosphor dispersed therein;
the material bearing the first phosphor dispersed therein appears at least substantially clear when the first source is off;
a second optical element comprises a container having a material bearing a second phosphor dispersed therein; and
the material bearing the second phosphor dispersed therein appears at least substantially clear when the second source is off.

11. A lighting device for variable color lighting, comprising:
a first solid state source configured to emit electromagnetic energy of a predetermined spectrum, the first solid state source comprising a first semiconductor chip and a first enclosure about the first semiconductor chip;
a first light guide positioned outside the first enclosure of the first solid state source, the first light guide for receiving electromagnetic energy from the first solid state source;
a first phosphor remotely deployed in the first light guide at a location for excitation by the electromagnetic energy from the first solid state source, the first phosphor being excitable by the electromagnetic energy of the predetermined spectrum and when excited for emitting visible light of a first color that is at least substantially pure, the first light guide being configured to allow diffuse emissions of light of the first color from the first phosphor;
a second solid state source configured to emit electromagnetic energy of said predetermined spectrum;
a second light guide for receiving electromagnetic energy from the second solid state source, the second solid state source comprising a second semiconductor chip and a second enclosure about the second semiconductor chip; and
a second phosphor remotely deployed in the second light guide at a location for excitation by the electromagnetic energy from the second solid state source, the second phosphor being excitable by electromagnetic energy of the predetermined spectrum and when excited for emitting visible light of a second color that is at least substantially pure, the second color being different from the first color, the second light guide being configured to allow diffuse emissions of light of the second color from the second phosphor,
wherein:
a visible light output of the lighting device includes a combination of first and second color lights from the first and second phosphors, from the first and second light guides, and
color of the visible light output of the lighting device is adjustable in response to adjustment of respective intensities of the electromagnetic energy of the predetermined spectrum emitted by the first and second solid state sources to adjust relative levels of excitations of the first and second phosphors.

12. A lighting system comprising the solid state lighting device of claim 11 and a controller coupled to the first and second solid state sources configured to implement the independent control of the first and second solid state sources.

13. The lighting device of claim 11, wherein the sources and the light guides are configured in a form factor of a lamp.

14. The lighting device of claim 13, wherein the form factor is a form factor of an incandescent lamp or tube lamp.

15. A variable color lighting device, comprising:
a plurality of independently controllable sources for all emitting electromagnetic energy in a predetermined spectrum, each source comprising a semiconductor chip and an enclosure about the semiconductor chip;
a plurality of optical elements positioned outside the enclosures of each source, each optical element arranged to receive electromagnetic energy from at least a respective one of the sources coupled thereto;
a plurality of different phosphors remotely deployed, a different one of the phosphors being disposed in each of the optical elements for excitation by electromagnetic energy from a respective one of the sources, each of the phosphors having an absolution spectrum that includes the predetermined spectrum of the electromagnetic energy from the sources, each of the phosphors having a different respective color emission spectrum that is at least substantially pure,
wherein:
the optical elements are arranged so that each phosphor in a respective one of the optical elements receives little or no excitation due to electromagnetic energy from any of the sources coupled to a different one of the optical elements,
a visible light output of the lighting device includes a combination of different color lights from the different phosphors, from the plurality of optical elements, and
color of the visible light output of the lighting device is adjustable in response to adjustment of respective intensities of the electromagnetic energy of the predetermined spectrum emitted by the solid state sources to adjust relative levels of excitations of the different phosphors.

16. The lighting device of claim 15, wherein each of the optical elements is configured to act as a light guide with respect to electromagnetic energy received from the respective source coupled thereto and to allow diffuse emissions of light emitted by the respective phosphor disposed therein when excited.

17. The lighting device of claim 15, wherein:
each of the sources comprises one or more light emitting diodes,
each light emitting diode is rated for producing electromagnetic energy of a wavelength in the range of 460 nm and below, and
the absorption spectrum of each phosphor has an upper limit at approximately 460 nm or below.

18. The lighting device of claim 15, further comprising:
an optical mixing element optically coupled to the optical elements to receive and mix light emitted by the phosphors when excited, from the optical elements, to form the visible light output of the device.

19. The lighting device of claim 18, wherein the optical mixing element forms an optical integrating cavity.

20. A lighting system comprising the lighting device of claim 15 and a controller coupled to the sources configured to implement the independent control of the sources.

\* \* \* \* \*